United States Patent
Grossier et al.

(10) Patent No.: US 8,996,943 B2
(45) Date of Patent: Mar. 31, 2015

(54) VOLTAGE REGULATOR WITH BY-PASS CAPABILITY FOR TEST PURPOSES

(71) Applicants: STMicroelectronics Pvt. Ltd., Greater Noida (IN); STMicroelectronics S.r.I., Agrate Brianza (IT)

(72) Inventors: Nicolas Bernard Grossier, Oreno di Vimercate (IT); Sabyasachi Das, Noida (IN); V Srinivasan, Greater Noida (IN)

(73) Assignees: STMicroelectronics S.R.L., Agrate Brianza (MB) (IT); STMicroelectronics International N.V., Amsterdam (NL)

( * ) Notice: Subject to any disclaimer, the term of this patent is extended or adjusted under 35 U.S.C. 154(b) by 126 days.

(21) Appl. No.: 13/722,594

(22) Filed: Dec. 20, 2012

(65) Prior Publication Data
US 2013/0271107 A1    Oct. 17, 2013

(30) Foreign Application Priority Data
Dec. 28, 2011    (IT) .............................. MI2011A2412

(51) Int. Cl.
| | | |
|---|---|---|
| G06F 11/00 | (2006.01) | |
| G05F 1/56 | (2006.01) | |
| G01R 31/00 | (2006.01) | |
| G01R 31/319 | (2006.01) | |
| G05F 1/10 | (2006.01) | |

(52) U.S. Cl.
CPC ... *G05F 1/56* (2013.01); *G01R 31/00* (2013.01); *G01R 31/31924* (2013.01); *G05F 1/10* (2013.01)
USPC .......................................... 714/742; 714/47.2

(58) Field of Classification Search
None
See application file for complete search history.

(56) References Cited

U.S. PATENT DOCUMENTS

| | | | |
|---|---|---|---|
| 5,652,524 A | 7/1997 | Jennion et al. | |
| 6,304,094 B2* | 10/2001 | Gilliam ...................... | 324/750.3 |
| 6,351,180 B1* | 2/2002 | Sher et al. .................... | 327/541 |

(Continued)

OTHER PUBLICATIONS

Italian Search Report and Written Opinion dated Nov. 9, 2012 from corresponding Italian Application No. MI2011A002412.

*Primary Examiner* — Daniel McMahon
(74) *Attorney, Agent, or Firm* — Allen, Dyer, Doppelt, Milbrath & Gilchrist, P.A.

(57) ABSTRACT

A Voltage regulator includes a first input terminal configured to receive an input supply voltage, includes a second input terminal configured to receive a regulated output supply voltage as a function of the input supply voltage or to receive a test supply voltage and comprises a power transistor including an input terminal configured to receive the input supply voltage and including an output terminal configured to generate the regulated output supply voltage. The Voltage regulator is configured, during a start-up phase of a test operation mode, to receive a control signal equal to the input supply voltage, is configured to receive the input supply voltage having a substantially increasing trend, detect that the input supply voltage is equal to a first voltage threshold and generate, as a function of the detected signal and of the control signal, a by-pass signal having a transition from a first logic value to a second logic value for indicating a by-pass status of the Voltage regulator, and is configured to receive the by-pass signal having the second logic value and open the power transistor. The second input terminal is configured, during the test operation mode, to receive the test supply voltage having a test value different from a nominal value of the regulated output supply voltage.

15 Claims, 13 Drawing Sheets

(56) References Cited

U.S. PATENT DOCUMENTS

| | | | |
|---|---|---|---|
| 6,765,404 B2* | 7/2004 | Gilliam | 324/750.3 |
| 2003/0038649 A1* | 2/2003 | D'Angelo | 324/763 |
| 2004/0082086 A1* | 4/2004 | Arabi et al. | 438/17 |
| 2004/0267482 A1* | 12/2004 | Robertson et al. | 702/118 |
| 2009/0119052 A1* | 5/2009 | Robertson et al. | 702/106 |
| 2010/0148808 A1 | 6/2010 | Butler | |
| 2011/0043188 A1 | 2/2011 | Xiong | |
| 2013/0321071 A1* | 12/2013 | Pietri et al. | 327/540 |
| 2014/0118036 A1* | 5/2014 | Pietri et al. | 327/143 |

* cited by examiner

VOLTAGE REGULATOR WITH BY-PASS CAPABILITY FOR TEST PURPOSES

CROSS REFERENCE TO RELATED APPLICATIONS

This application claims the priority benefit of Italian patent application number MI2011A002412, filed on Dec. 28, 2011, which is hereby incorporated by reference to the maximum extent allowable by law.

BACKGROUND

1. Technical Field

The present disclosure relates to the electronics field. More in particular, the present invention concerns a voltage regulator with by-pass capability for test purposes.

2. Discussion of the Related Art

A voltage regulator may be an electronic device designed to receive an input voltage and to generate therefrom a regulated output voltage at a constant voltage level, despite fluctuations of the input voltage and despite a variable output load.

A voltage regulator is integrated into a system-on-chip, wherein the regulated output voltage is used as a supply voltage for electronic components inside the system-on-chip.

A common linear voltage regulator for providing a regulated output voltage smaller than the input voltage is composed of a controller and of a transistor (such as a BJT or a MOS), wherein the controller is such to generate a control signal driving the control terminal (base for the BJT or gate for the MOS) of the power transistor and wherein the power transistor is interposed between the input voltage and the output voltage. A power transistor separate from the controller is used in case the transistor requires an high power dissipation.

In the automotive field, a voltage regulator within a system-on-chip is needed, for example, for providing a regulated supply voltage to a memory within the system-on-chip; in this case it is necessary to ensure an high safety of the system-on-chip and thus it is necessary, before delivering the system-on-chip for selling, to perform the test of the operation of the electronic components inside the system-on-chip with the voltage regulator disabled at the start-up of the test, in order to be able to supply the electronic components inside the system-on-chip with a test supply voltage greater or smaller than the nominal value of the output low supply voltage.

A known solution for disabling the voltage regulator at the start-up of the test is to force the regulated output voltage to an higher value, so that the current source inside the voltage regulator is switched-off; afterwards, the overall voltage regulator is disabled (by means of software or JTAG protocol) and finally the output voltage is forced to a lower value required for performing the test. This solution has the disadvantage to require a too long time for disabling the voltage regulator, because it requires some time in order to stabilize the output voltage at the wanted value for the test.

Moreover, some known solutions to disable the voltage regulator at the start-up of the test have the disadvantage of needing the generation of complex sequences of values of several signals, which are also different between the switch-off and the switch-on phase.

SUMMARY

According to an embodiment, there is provided a voltage regulator comprising a first input terminal configured to receive an input supply voltage; a second input terminal configured to receive a regulated output supply voltage as a function of the input supply voltage or to receive a test supply voltage; a power transistor including an input terminal configured to receive the input supply voltage and including an output terminal configured to generate the regulated output supply voltage; wherein the voltage regulator is configured, during a start-up phase of a test operation mode, to receive a control signal equal to the input supply voltage; receive the input supply voltage having a substantially increasing trend, detect that the input supply voltage is equal to a first voltage threshold and generate, as a function of the detected signal and of the control signal, a by-pass signal having a transition from a first logic value to a second logic value for indicating a by-pass status of the voltage regulator; receive the by-pass signal having the second logic value and open the power transistor; and wherein the second input terminal is configured, during the test operation mode, to receive the test supply voltage having a test value different from a nominal value of the regulated output supply voltage.

According to an embodiment, the voltage regulator further includes a switch configured to receive the input supply voltage and transmit the input supply voltage over the control signal, during the test operation mode; and receive the control signal and transmit the control signal over another control signal to control the operation of the power transistor, during a normal operation mode; wherein the voltage regulator includes a voltage regulator circuit configured, during the normal operation mode, to generate the control signal to close the power transistor, and wherein the power transistor includes a control terminal for receiving, during the normal operation mode, the other control signal equal to the control signal.

According to an embodiment, the voltage regulator includes a power-on-reset module configured, during the start-up phase of the test operation mode, to receive the input supply voltage having the increasing trend and detect that the input supply voltage is equal to the first voltage threshold; and to generate therefrom a power-on-reset signal having a transition from a first logic value to a second logic value; and wherein the voltage regulator is configured to generate, as a function of the power-on-reset signal having the second logic value and of the control signal equal to the input supply voltage, the by-pass signal having said transition from the first logic value to the second logic value.

According to another embodiment, the power-on-reset module is further configured, during the start-up phase of the test operation mode, to receive the input supply voltage having the substantially increasing trend and detect that the input supply voltage is equal to a second threshold smaller than the first voltage threshold; and to generate therefrom the power-on-reset signal having the first logic value; and wherein the voltage regulator is further configured to generate, as a function of the power-on-reset signal having the first logic value and of the control signal equal to the input supply voltage, the by-pass signal having the first logic value for indicating an enable status of the voltage regulator.

According to another embodiment, the power-on-reset module is further configured, during a start-up phase of the normal operation mode, to receive the input supply voltage having the increasing trend, detect that the input supply voltage is equal to the first voltage threshold and generate therefrom the power-on-reset signal having a transition from the first logic value to the second logic value; wherein the voltage regulator is further configured, during the normal operation mode, to generate, as a function of the power-on-reset signal having the second logic value and of the control signal equal to a logic value, the by-pass signal having the first logic value for indicating an enable status of the voltage regulator; to receive the by-pass signal having the first logic value and switch-on the voltage regulator circuit; wherein the voltage regulator circuit is configured, during the normal operation mode, to receive the by-pass signal having the first logic value and generate therefrom the control signal to close the power transistor; and wherein the power transistor is configured, during the normal operation mode, to receive the input supply voltage and generate therefrom the regulated output supply voltage over the second input terminal.

According to another embodiment, the voltage regulator further includes a pull-down resistor for generating the control signal, such to enable the operation of the voltage regulator at the start-up of the normal operation mode or such to recover the enable status of the voltage regulator in case of an unwanted transition of the voltage regulator to the by-pass status during the normal operation mode.

According to another embodiment, there is provided a method for performing the by-pass of a voltage regulator at the start-up phase of a test operation mode, the method comprising the steps of providing the voltage regulator including a first input terminal for receiving an input supply voltage, including a second input terminal for receiving a test supply voltage or for receiving a regulated output supply voltage as a function of the input supply voltage and including a power transistor for generating the regulated output supply voltage; activating the test operation mode; receiving a control signal equal to the input supply voltage; receiving the input supply voltage having a substantially increasing trend, detecting that the input supply voltage is equal to a first voltage threshold and generating, as a function of the detected signal and of the control signal, a by-pass signal having a transition from a first logic value to a second logic value for indicating a by-pass status of the voltage regulator; receiving the by-pass signal having the second logic value and opening the power transistor; receiving at the second input terminal the test supply voltage having a test value different from a nominal value of the regulated output supply voltage.

The Applicant has perceived that the Voltage regulator according to various embodiments has the following advantages:

it allows to easily perform the by-pass of the Voltage regulator at the start-up during a test operation mode, without requiring specific complex sequences of values for performing the by-pass;

it does not require the use of dedicated pins for performing the by-pass of the Voltage regulator at the start-up of the test operation mode;

it provides a safe solution for recovering the enable of the Voltage regulator in case of an unwanted by-pass of the Voltage regulator during a normal operation mode;

it reduces the time required to perform the by-pass of the Voltage regulator at the start-up during the test operation mode.

BRIEF DESCRIPTION OF THE DRAWINGS

Further characteristics and the advantages of the embodiments will result from the following description which are provided only as an example with reference to the enclosed drawings, wherein.

DETAILED DESCRIPTION

Figure 1:
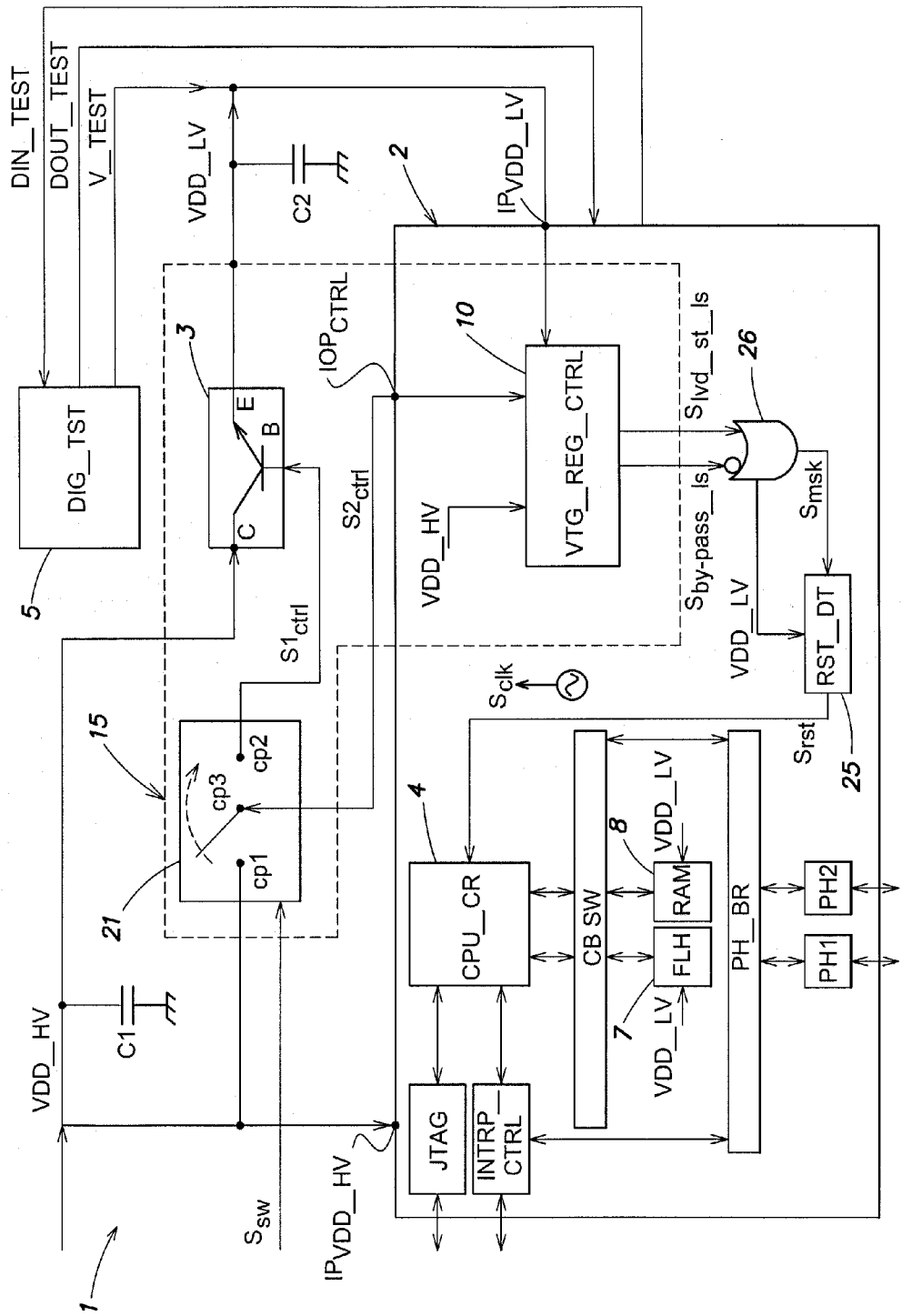
FIG. 1 schematically shows a Test system according to a first embodiment.

Referring to FIG. 1, it shows a Test system 1 according to the first embodiment.

The Test system 1 includes a System-on-chip 2, a Power transistor 3, a switch 21, a Digital Tester 5, an input capacitor C1 and an output capacitor C2.

The System-on-chip 2 is implemented into an integrated circuit for automotive body applications and automotive safety applications such as an airbag.

The System-on-chip 2, when it is placed in the Test system 1, has two operations modes:

a normal operation mode wherein the System-on-chip 2 is operating normally, that is the System-on-chip 2 is performing the functionality for which it is designed;

a test operation mode wherein it's performed the test of the operation of one or more of the electronic components inside the System-on-chip 2.

The test operation mode and the normal operation mode can be activated by a test operator after completing the manufacturing process of the System-on-chip 2 and before the delivering of the System-on-chip 2 for selling. In particular, the System-on-chip 2, the power transistor 3 and the switch 21 are mounted on a test board which is represented by the Test system 1 or are mounted on a test machine; the test board or the test machine is operating in the plant of the manufacturer of the System-on-chip 2 and an electrical test of the System-on-chip 2 is performed, using for example Logic or Memory Built-In Self Test based on scan chains during the test operation mode. The test operation mode and the normal operation mode can be activated several times, for example alternating each other, that is first the test operation mode is activated, then the normal operation mode is activated, then the test operation mode is again activated, then the normal operation mode is again activated, etc.

The normal operation mode can be activated also after the selling, when the System-on-chip 2 is mounted on a Printed Circuit Board (different from the Test system 1) operating for example in the automotive field (such as in a car).

The System-on-chip 2 includes an input pin $IP_{VDD\_HV}$ for receiving an input high supply voltage VDD_HV, wherein the nominal value of the input high supply voltage VDD_HV can be affected by fluctuations; for example, the nominal value of the input high supply voltage VDD_HV is equal to 5.5 or 3.3 Volts.

The System-on-chip 2 further includes an input pin $IP_{VDD\_LV}$ for receiving an output low supply voltage VDD_LV having a nominal value smaller than the nominal value of the input high supply voltage VDD_HV when the System-on-chip 2 is in the normal operation mode or for receiving a test supply voltage signal V_TEST when the System-on-chip 2 is in the test operation mode.

When the System-on-chip 2 is in the normal operation mode, the input pin $IP_{VDD\_LV}$ is such to receive the output low supply voltage VDD_LV generated by the power transistor 3, wherein the output low supply voltage VDD_LV is obtained from the input high supply voltage VDD_HV and is maintained at a substantially constant voltage value, despite of the fluctuations of the input high supply voltage VDD_HV and despite of variations of the load connected to the input pin $IP_{VDD\_LV}$. For example, the nominal value of the output low supply voltage VDD_LV is equal to 1.2 Volts. The output low supply voltage VDD_LV is used as supply voltage of electronic components inside the System-on-chip 2, such as a RAM memory 8 or a Flash memory 7.

Moreover, the input pin $IP_{VDD\_LV}$ is such to receive the test supply voltage signal V_TEST generated by the Digital Tester 5 when the System-on-chip 2 is in the test operation mode, as it will be explained more in detail afterwards.

The System-on-chip 2 further includes an input/output pin $IOP_{CTRL}$ for receiving/generating a second control signal $S2_{ctrl}$ (which is a bi-directional signal), which will be explained more in detail afterwards.

The input capacitor C1 is connected between the input pin $IP_{VDD\_HV}$ and ground and has the function to filter voltage variations of the input high supply voltage VDD_HV.

The output capacitor C2 is connected between the input pin $IP_{VDD\_LV}$ and ground and has the function to filter voltage variations of the output low supply voltage VDD_LV.

The power transistor 3 may be external to the System-on-chip 2. The power transistor 3 includes a first terminal C connected to the input pin $IP_{VDD\_HV}$ for receiving the input high supply voltage VDD_HV, includes a second terminal E connected to the input pin $IP_{VDD\_LV}$ for generating the output low supply voltage VDD_LV and includes a control terminal B for receiving a first control signal $S1_{ctrl}$. The power transistor 3 is for example a Bipolar Junction Transistor of npn type (as shown in FIG. 1), wherein the first terminal C is the collector, the second terminal E is the emitter and the control terminal B is the base. Alternatively, the power transistor 3 is a n-channel MOS transistor, wherein the control terminal B is the gate, the first terminal C is the drain and the second terminal E is the source.

The switch 21 is external to the System-on-chip 2 and it has the function to switch the second control signal $S2_{ctrl}$ (which is a bi-directional signal) between the first control signal $S1_{ad}$ and the input high supply voltage VDD_HV, as a function of a switch signal $S_{sw}$. More specifically, the switch 21 has a connection point cp3 connected to an input/output terminal carrying the second control signal $S2_{ctrl}$, a connection point cp1 connected to an input terminal carrying the input high supply voltage VDD_HV and a connection point cp2 connected to an output terminal carrying the first control signal $S1_{ctrl}$. The switch signal $S_{sw}$ is such to have a first logic value (for example, high) for connecting the connection point cp3 to the connection point cp1 during the test operation mode (see FIG. 3A) and it is such to have a second logic value (for example, low) for connecting the connection point cp3 to the connection point cp2 during the normal operation mode (see FIG. 4A). In particular, the first logic value and the second logic value are assigned by a test operator during the test operation mode and the normal operation mode respectively performed after completing the manufacturing process of the System-on-chip 2 and before selling the System-on-chip 2.

When the System-on-chip 2 is placed in the Test system 1 and is in the normal operation mode, the connection point cp3 is connected to the connection point cp2 (see FIG. 4A) and thus the first control signal $S1_{ctrl}$ is equal to the second control signal $S2_{ctrl}$ generated by the Voltage regulator Controller 10; in particular, the second control signal $S2_{ctrl}$ is generated by a Voltage regulator Circuit 22 inside the Voltage regulator Controller 10 (see FIG. 4B), as it will be explained more in detail afterwards.

When the System-on-chip 2 is placed in the Test system 1 and is in the test operation mode, the connection point cp3 is connected to the connection point cp1 (see FIG. 3A), thus the second control signal $S2_{ctrl}$ is equal to the input high supply voltage VDD_HV and the Voltage regulator Controller 10 is such to receive the voltage value carried over the second control signal $S2_{ctrl}$; in particular, the voltage value carried over the second control signal $S2_{ctrl}$ is received by a By-pass detector 30 inside the Voltage regulator Controller 10 (see FIG. 3B), as it will be explained more in detail afterwards. Moreover, the connection point cp2 is floating, the first control signal $S1_{ctrl}$ and the control terminal B of the power transistor 3 have undefined values and the power transistor 3 is open.

The Digital Tester 5 has the function to perform, when the System-on-chip 2 is placed in the Test system 1 and is operating in the test operation mode, the test of the operation of one or more of the electronic components inside the System-on-chip 2 (such as the Flash 7 or the RAM memory 8), wherein the operation test is achieved by supplying the electronic components under test with a value of the test supply voltage V_TEST different from the nominal value of the output low supply voltage VDD_LV; more in general, during the test operation mode is performed the test of the operation of all the digital logic (inside the System-on-chip 2) supplied by the test supply voltage signal V_TEST. Moreover, the Digital Tester 5 has the function to perform, when the System-on-chip 2 is placed in the Test system 1 and is operating in the normal operation mode, the test of the functionality the System-on-chip 2, wherein the functionality test is performed by supplying one or more components inside the System-on-chip 2 using the nominal value of the output low supply voltage VDD_LV.

In particular, the Digital Tester 5 includes an output voltage test terminal for generating, when the System-on-chip 2 is operating in the test operation mode, the test supply voltage V_TEST for supplying the electronic components inside the System-on-chip 2 with a wanted value of the test supply voltage V_TEST greater or smaller than the nominal value (i.e., the one regulated during the normal operation mode) of the output low supply voltage VDD_LV. For example, if the nominal value of the regulated output low supply voltage VDD_LV is equal to 1.2 V, the value of the test supply voltage V_TEST is comprised between 0.8 V and 1.4 V.

The Digital Tester 5 further includes one or more output data terminals for generating one or more output data test signals DOUT_TEST for carrying, when the System-on-chip 2 is placed in the Test system 1 and is operating in the test operation mode, test patterns using Automatic Test Pattern Generation (such as a Logic Built-In Self Test, Memory Built-In Self Test, boundary-scan test); the Digital Tester 5 further includes one or more input data terminals for receiving one or more input data test signal DIN_TEST for carrying the results of the test performed on the components inside the System-on-chip 2, such as the RAM memory 8 or the Flash memory 7. The Digital Tester 5, when the System-on-chip 2 is operating in the test operation mode, is such to generate an alarm signal in case of detecting a fault affecting the operation of one or more of the electronic components (inside the System-on-chip 2) under test.

Moreover, when the System-on-chip 2 is placed in the Test system 1 and is in the normal operation mode, the Digital Tester 5 is such to generate and transmit over the output data terminals (for example using the JTAG protocol) the output data test signals DOUT_TEST carrying a software program (to be executed on a CPU core 4 inside the System-on-chip 2) for performing the test of the functionality of the System-on-chip 2. The RAM memory 8 inside the System-on-chip 2 is such to store the transmitted software program and is such to store the results of the functionality test. The Digital Tester 5 is such to receive at the input data terminals (for example using the JTAG protocol) the input data test signal DIN_TEST carrying the results of the functionality test.

The System-on-chip 2 includes the CPU core 4, a clock generator for generating a clock signal $S_{clk}$, the Flash memory 7, the Random Access Memory (RAM) 8, a cross-bar switch for connecting the CPU core 4 with the Flash memory 7 and the RAM memory 8, an Interrupt controller, a JTAG controller, one or more peripherals and a Peripheral bridge for connecting the Interrupt controller to the peripherals and for connecting the peripherals to the CPU core 4.

The RAM memory 8 and the Flash memory 7 have digital input terminals which are supplied by the output low supply voltage VDD_LV during the normal operation mode and are supplied by the test supply voltage V_TEST during the test operation mode. For the sake of simplicity the System-on-chip 2 shows the Flash memory 7 and the RAM memory 8 which are supplied by the output low supply voltage VDD_LV during the normal operation mode or by the test supply voltage V_TEST during the test operation mode, but more in general the System-on-chip 2 can further include digital logic which is supplied by the output low supply voltage VDD_LV during the normal operation mode or is supplied by the test supply voltage V_TEST during the test operation mode.

The System-on-chip 2 further includes an OR logic gate 26, a Reset detector 25 and a Voltage regulator Controller 10, which will be explained more in detail afterwards.

The Voltage regulator Controller 10, the power transistor 3 and the switch 21 form a Voltage regulator 15, which has a by-pass or enable status.

Specifically, when the Voltage regulator 15 is in the enable status, the Voltage regulator 15 is enabled, that is the Voltage regulator 15 is such to receive the input high supply voltage VDD_HV and it is such to generate therefrom the output low supply voltage VDD_LV, which is maintained at a substantially constant voltage value. When the Voltage regulator 15 is in the by-pass status, the Voltage regulator 15 is by-passed, that is the input pin $IP_{VDD\_LV}$ is driven by the output voltage test terminal of the Digital Tester 5 and thus the voltage value at the input pin $IP_{VDD\_LV}$ is equal to the value of the test supply voltage V_TEST generated by the Digital Tester 5.

Therefore the Voltage regulator 15 includes the Controller 10 which is inside the System-on-chip 2, includes the switch 21 which is outside the System-on-chip 2 and includes the power transistor 3 which is outside the System-on-chip 2 for allowing a better power dissipation.

It is worth noting that other arrangements are possible for the Voltage regulator 15, such as:

both the Controller 10 and the transistor 3 are outside the System-on-chip 2;

a Voltage regulator 15 which is a single module including the Controller 10, the transistor 3 and the switch 21, wherein this module can be inside or outside the System-on-chip 2.

The Voltage regulator Controller 10 is supplied by the input high supply voltage VDD_HV. The Voltage regulator Controller 10 includes an input/output terminal for receiving/generating the second control signal $S2_{ctrl}$ from the input/output pin $IOP_{CTRL}$ and includes a first output terminal for generating a level shifted by-pass signal $S_{by\text{-}pass\_ls}$ for indicating the status of by-pass or enable of the Voltage regulator 15. For example, the level shifted by-pass signal $S_{by\text{-}pass\_ls}$ has a low logic value for indicating the by-pass status of the Voltage regulator 15 and it has an high logic value for indicating the enable status of the Voltage regulator 15.

The Voltage regulator Controller 10 further includes an input terminal for receiving the output low supply voltage VDD_LV in order to monitor its voltage value and includes a second output terminal for generating a level shifted low voltage status signal $S_{lvd\_st\_ls}$ having a logic value for indicating if the value of the output low supply voltage VDD_LV is smaller than a low voltage threshold $V_{th\_lv}$. For example, the level shifted low voltage status signal $S_{lvd\_st\_ls}$ is active low, that is it has an high logic value for indicating that the value of the output low supply voltage VDD_LV is equal to or greater than the low voltage threshold $V_{th\_lv}$ and it has a low logic value for indicating that the value of the output low supply voltage VDD_LV is smaller than the low voltage threshold $V_{th\_lv}$. The value of the low voltage threshold $V_{th\_lv}$ is the minimum one which allows a correct operation of the electronics components within the System-on-chip 2 (such as the Flash memory 7 and the RAM memory 8) which are supplied by the output low supply voltage VDD_LV. For example, if the nominal value of the output low supply voltage VDD_LV is equal to 1.2 V, the value of the low voltage threshold $V_{th\_lv}$ is equal to 1.1 V.

When the System-on-chip 2 is placed in the Test system 1 and is operating in the normal operation mode, the Voltage regulator 15 is in the enable status, that is the Voltage regulator 15 is enabled and is operating normally such to generate the output low supply voltage VDD_LV which is regulated: in this case the input pin $IP_{VDD\_LV}$ is driven by the second terminal E of the power transistor 3 and thus the voltage value at the input pin $IP_{VDD\_LV}$ is equal to the output low supply voltage VDD_LV generated by the Voltage regulator 15, in particular generated by the second terminal E of the power transistor 3.

When the System-on-chip 2 is placed in the Test system 1 and is operating in the test operation mode, the Voltage regulator 15 is disabled, that is the Voltage regulator 15 is in the by-pass status wherein the Voltage regulator 15 is by-passed: in this case the input pin $IP_{VDD\_LV}$ is driven by the output voltage test terminal of the Digital Tester 5 and thus the voltage value at the input pin $IP_{VDD\_LV}$ is equal to the value of the test supply voltage V_TEST generated by the Digital Tester 5.

The test operation mode includes a start-up phase wherein the System-on-chip 2 is supplied by the input high supply voltage VDD_HV for the first time or wherein the System-on-chip 2 is supplied again after a switch-off of the Test system 1. The test operation mode is activated for performing the test of the operation of the electronic components inside the System-on-chip 2 with the Voltage regulator 15 by-passed, in order to be able to supply the electronic components under test (such as, Flash memory 7, RAM memory 8) inside the System-on-chip 2 with a test value $V_{ts\_lv}$ of the test supply voltage V_TEST greater or smaller than the nominal value (i.e., the one regulated during the normal operation mode) of the output low supply voltage VDD_LV.

The OR logic gate 26 is supplied by the output low supply voltage VDD_LV. The OR logic gate 26 includes a first input terminal for receiving an inverted level shifted by-pass signal $\hat{S}_{by\text{-}pass\_ls}$ calculated from a logic NOT of the level shifted by-pass signal $S_{by\text{-}pass}$, a second input terminal for receiving the level shifted low voltage status signal $S_{lvd\_st\_ls}$ and includes an output terminal for generating a masked signal $S_{msk}$ equal to the OR logic between the inverted level shifted by-pass signal $\hat{S}_{by\text{-}pass\_ls}$ and the level shifted low voltage status signal $S_{lvd\_st\_ls}$; in particular, the masked signal $S_{msk}$ has a logic value for masking or allowing the transmission of the value of the level shifted low voltage status signal $S_{lvd\_st\_ls}$ towards the Reset detector 25 (and thus it has a logic value for masking or allowing the transmission of the value of the low voltage status signal $S_{lvd\_st}$ towards the Reset detector 25).

The Reset detector 25 is supplied by the output low supply voltage VDD_LV. The Reset detector 25 includes an input terminal for receiving the masked signal $S_{msk}$ and an output terminal for generating a reset signal $S_{rst}$ having a logic value for performing or preventing the reset of the CPU core 4. For example, the reset signal $S_{rst}$ is active low and the following behavior occurs:

when the reset signal $S_{rst}$ has a low logic value, it is performed the reset of the CPU core 4, which is in a reset mode wherein the clock signal $S_{clk}$ is disabled, the peripheral clocks are disabled, the timing signals are disabled and the content of most registers of the CPU core 4 are cleared;

when the reset signal $S_{rst}$ has an high logic value, the reset of the CPU core 4 is prevented, that is the CPU core 4 is in a normal mode, wherein the clock signal $S_{clk}$ is enabled, the peripheral clocks are enabled and the timing signals are enabled.

The reset signal $S_{rst}$ controls the System-on-chip 2 such that the CPU core 4 can operate in the normal mode only when the output low supply voltage VDD_LV is equal to or greater than the low voltage threshold $V_{th\_lv}$.

Figure 2:
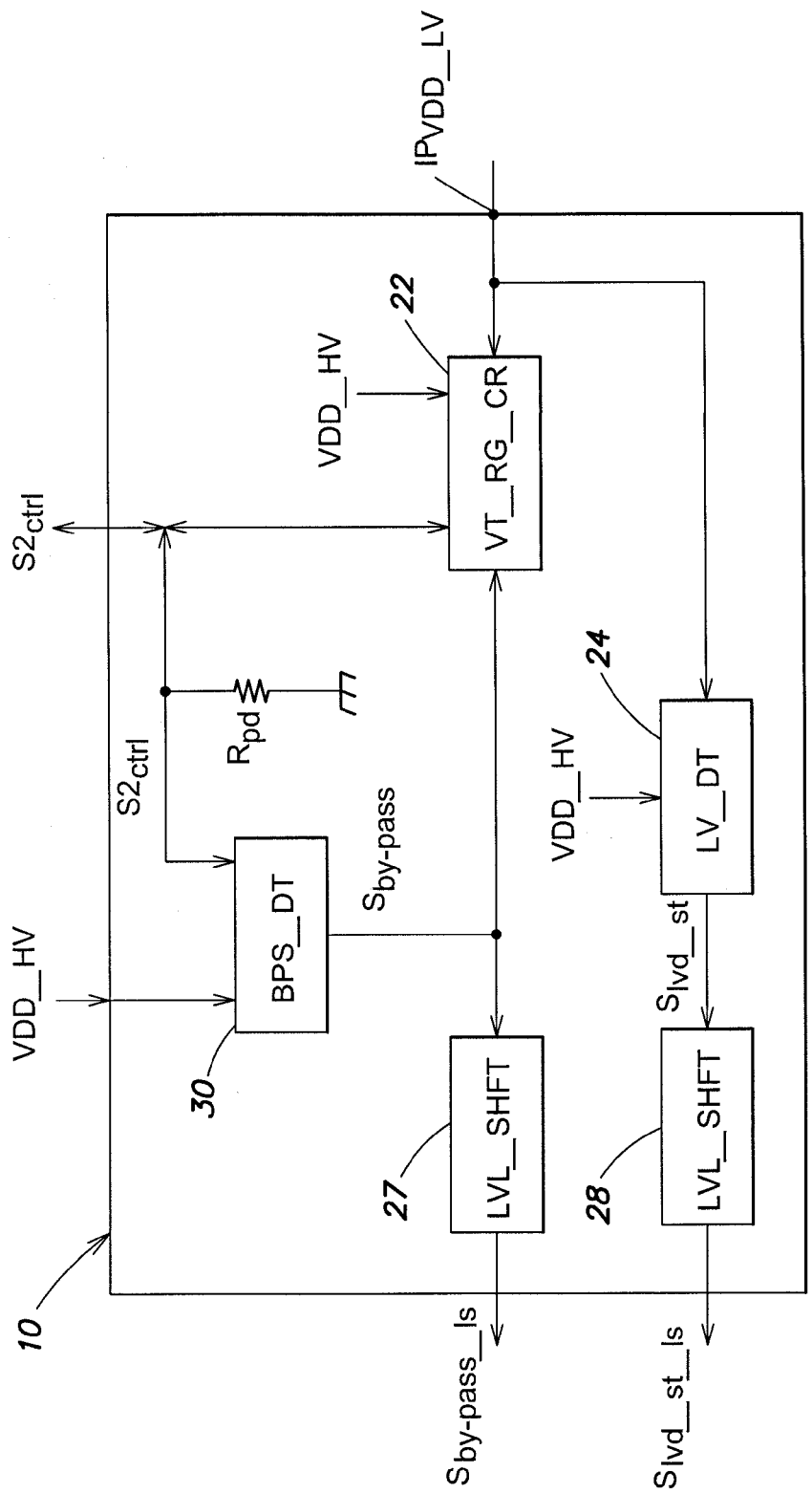
FIG. 2 schematically shows a Voltage regulator Controller according to the first embodiment.

Referring to FIG. 2, it shows the Voltage regulator Controller 10 according to the first embodiment of the invention.

The Controller 10 includes a By-pass detector 30, a Low-voltage detector 24, a pull-down resistor $R_{pd}$, a Voltage regulator Circuit 22, a first level shifter 27 and a second level shifter 28.

The Voltage regulator circuit 22 is supplied by the input high supply voltage VDD_HV. The Voltage regulator circuit 22 includes a first input terminal for receiving the input high supply voltage VDD_HV, includes a second input terminal for receiving the by-pass signal $S_{by\text{-}pass}$, includes a third input terminal for receiving the output low supply voltage VDD_LV; the Voltage regulator circuit 22 further includes an input/output terminal for generating a voltage value of the second control signal $S2_{ctrl}$ in order to drive the control terminal B of the power transistor 3 when the System-on-chip 2 is in the normal operation mode and for receiving the voltage value carried over the second control signal $S2_{ctrl}$ when the System-on-chip 2 is in the test operation mode.

More specifically, the Voltage regulator Circuit 22 is such to receive the by-pass signal $S_{by\text{-}pass}$ indicating the enable status of the Voltage regulator 15, it is such to receive the output low supply voltage VDD_LV equal to or greater than its nominal value and it is such to generate therefrom the second control signal $S2_{ctrl}$ carrying a bias value $V_B$ for driving the control terminal B of the power transistor 3, in order to close the power transistor 3 and in order to maintain the output low supply voltage VDD_LV at a substantially constant value during the normal operation mode. For example, the bias value $V_B$ is equal to 1.8 V.

Moreover, when the Voltage regulator Circuit 22 is such to receive the by-pass signal $S_{by\text{-}pass}$ indicating the by-pass status of the Voltage regulator 15, the Voltage regulator circuit 22 is switched-off and its input/output terminal is operating as an input terminal such to receive the voltage value carried over the second control signal $S2_{ctrl}$.

The Low voltage detector 24 is supplied by the input high supply voltage VDD_HV. The Low voltage detector 24 includes an input terminal for receiving the output low supply voltage VDD_LV in order to monitor its voltage value and includes an output terminal for generating the low voltage status signal $S_{lvd\_st}$ having a logic value for indicating if the value of the output low supply voltage VDD_LV is smaller than the low voltage threshold $V_{th\_lv}$; for example, the low voltage status signal $S_{lvd\_st}$ is active low, that is it has a high logic value for indicating that the value of the output low supply voltage VDD_LV is equal to or greater than the low voltage threshold $V_{th\_lv}$ and it has a low logic value for indicating that the value of the output low supply voltage VDD_LV is smaller than the low voltage threshold $V_{th\_lv}$.

The first level shifter 28 has the function to shift the voltage level from an input logic value to an output logic value. Specifically, the first level shifter 28 includes an input terminal for receiving the low voltage status signal $S_{lvd\_st}$ having a logic value according to the input high supply voltage VDD_HV and includes an output terminal for generating a level shifted low voltage status signal $S_{lvd\_st\_ls}$ having the logic value according to the output low supply voltage VDD_LV. For example, the first level shifter 28 is such to receive the low voltage status signal $S_{lvd\_st}$ having an high logic value equal to 3.3 V and it is such to generate therefrom the level shifted low voltage status signal $S_{lvd\_st\_ls}$ having an high logic value equal to 1.2 V.

The By-pass detector 30 is supplied by the input high supply voltage VDD_HV. The By-pass detector 30 includes an input terminal for receiving the second control signal $S2_{ctrl}$ and includes an output terminal for generating the by-pass signal $S_{by\text{-}pass}$ having a logic value for indicating the by-pass status or the enable status of the Voltage regulator 15, as it will be described more in detail afterwards in the description of FIG. 4. For example, the by-pass signal $S_{by\text{-}pass}$ has a low logic value for indicating the by-pass status of the Voltage regulator 15 and it has an high logic value for indicating the enable status of the Voltage regulator 15.

The second level shifter 27 has the function to shift the voltage level from an input logic value to an output logic value. Specifically, the second level shifter 27 includes an input terminal for receiving the by-pass signal $S_{by\text{-}pass}$ having a logic value according to the input high supply voltage VDD_HV and includes an output terminal for generating a level shifted by-pass signal $S_{by\text{-}pass\_ls}$ having the logic value according to the output low supply voltage VDD_LV. For example, the second level shifter 27 is such to receive the by-pass signal $S_{by\text{-}pass}$ having an high logic value equal to 3.3 V and it is such to generate therefrom the level shifted by-pass signal $S_{by\text{-}pass\_ls}$ having an high logic value equal to 1.2 V.

The pull-down resistor $R_{pd}$ is connected to the input/output terminal of the Voltage regulator circuit 22 and to the input terminal of the By-pass detector 30. The pull-down resistor $R_{pd}$ has the function to prevent to by-pass the Voltage regulator 15 at the start-up of the normal operation mode, as it will be explained more in detail afterwards.

Figure 5:
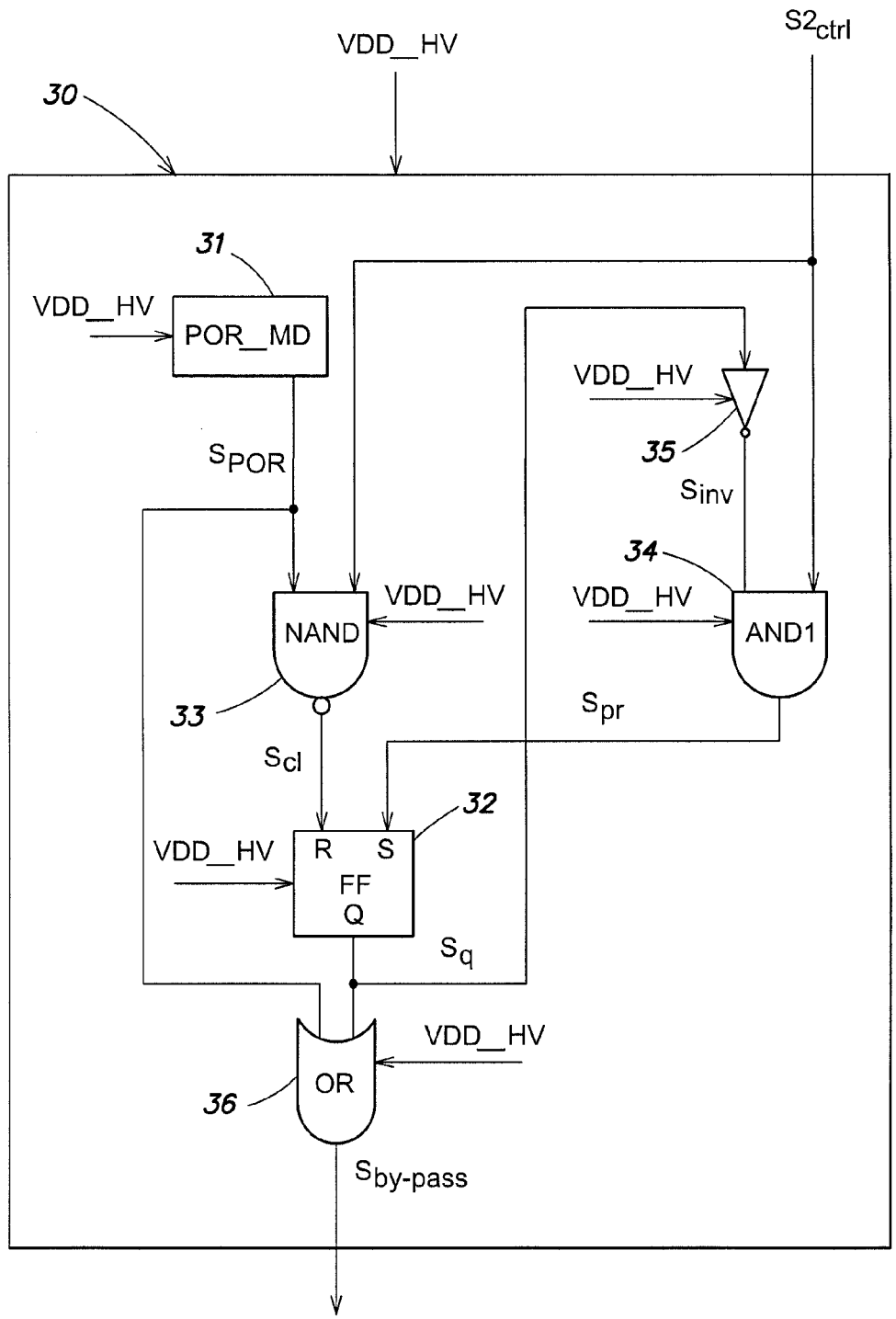
FIG. 5 schematically shows a By-pass detector according to the first embodiment.

Referring to FIG. 5, it shows more in detail the By-pass detector 30 according to the first embodiment of the invention.

The By-pass detector 30 includes an inverter logic gate 35, an AND logic gate 34, a NAND logic gate 33, a set-reset Flip-flop 32, an OR logic gate 36 and a Power-on-reset module 31: these components are supplied by the input high supply voltage VDD_HV and are such to operate correctly when the value of the input high supply voltage VDD_HV is greater than or equal to a power-on threshold value $V_{th\_pw-on}$. Therefore the value of the power-on threshold value $V_{th\_pw-on}$ is the minimum one which allows a correct operation of the electronics components inside the By-pass detector 30. For example, if the nominal value of the input high supply voltage VDD_HV (that is, the value of the input high supply voltage VDD_HV during the normal operation mode) is equal to 3.3 V, the power-on threshold value $V_{th\_pw-on}$ is equal to 0.8 V.

The inverter logic gate 35 is such to receive a status signal $S_q$ and it is such to generate an inverted signal $S_{inv}$ equal to the logic NOT of the status signal $S_q$.

The AND logic gate 34 is such to receive the second control signal $S2_{ctrl}$ and the inverted signal $S_{inv}$ and it is such to generate a preset signal $S_{pr}$ equal to the logic AND between the second control signal $S2_{ctrl}$ and the inverted signal $S_{inv}$.

The Power-on-reset module 31 has the function to monitor the input high supply voltage VDD_HV at the start-up of the System-on-chip 2, that is when the System-on-chip 2 is supplied for the first time or when the System-on-chip 2 is supplied again after a switch-off of the Test system 1. The Power-on-reset module 31 includes an output terminal for generating a power-on-reset signal $S_{POR}$ having a logic value for indicating if the input high supply voltage VDD_HV is greater or smaller than a high voltage threshold $V_{th\_hv}$. For example, the power-on-reset signal $S_{POR}$ is active high, that is it has an high logic value for indicating that the input high supply voltage VDD_HV is smaller than the high voltage threshold $V_{th\_hv}$ and it has a low logic value for indicating that the input high supply voltage VDD_HV is equal to or greater than the high voltage threshold $V_{th\_hv}$. The value of the high voltage threshold $V_{th\_hv}$ is the minimum one which allows a correct operation of the Voltage regulator 15 during the normal operation mode, in particular of the Voltage regulator circuit 22. For example, if the nominal value of the input high supply voltage VDD_HV is equal to 3.3 V and the nominal value of the output low supply voltage VDD_LV is equal to 1.2 V during the normal operation mode, the high voltage threshold value $V_{th\_hv}$ is comprised between 1.5 V and 2.7 V. In this case, supposing that the power-on-reset signal $S_{POR}$ is active high, at the start-up of the System-on-chip 2 the value of the input high supply voltage VDD_HV is increasing from 0 V to 1.5 V and during the same time period the value of the power-on-reset signal $S_{POR}$ is increasing from 0 V to 1.5 V. When the value of the input high supply voltage VDD_HV has reached the high voltage threshold value $V_{th\_hv}$=1.5 V, the power-on-reset signal $S_{POR}$ has a falling edge to the low logic value and this value is maintained, unless the value of the input high supply voltage VDD_HV decreases below the value of the high voltage threshold $V_{th\_hv}$.

The NAND logic gate 33 is such to receive the power-on-reset signal $S_{POR}$ and the second control signal $S2_{ctrl}$ and it is such to generate a clear signal $S_{cl}$ equal to the logic NAND between the power-on-reset signal $S_{POR}$ and the second control signal $S2_{ctrl}$.

The set-reset flip-flop 32 has a set input terminal S for receiving the preset signal $S_{pr}$, a reset input terminal R for receiving the clear signal $S_{cl}$ and an output data terminal Q for generating the status signal $S_q$.

For example, the preset signal $S_{pr}$ and the clear signal $S_{cl}$ are active low. In this case, the flip-flop 32 is such to generate an high logic value at the output data terminal Q when the preset signal $S_{pr}$ at the set terminal S has a low logic value and the clear signal $S_{cl}$ at the reset terminal R has an high logic value and it is such to generate a low logic value at the output data terminal Q when the clear signal $S_{cl}$ at the reset terminal R has a low logic value. The flip-flop 32 is such to maintain the previous value over the output data terminal Q when the logic value at the set terminal S and at the reset terminal R are both high.

The OR logic gate 36 is such to receive the power-on-reset signal $S_{POR}$ and the status signal $S_q$ and it is such to generate the by-pass signal $S_{by-pass}$ equal to the logic OR between the power-on-reset signal $S_{POR}$ and the status signal $S_q$, wherein the by-pass signal $S_{by-pass}$ has a logic value for indicating the by-pass or enable status of the Voltage regulator 15.

Figure 6A:
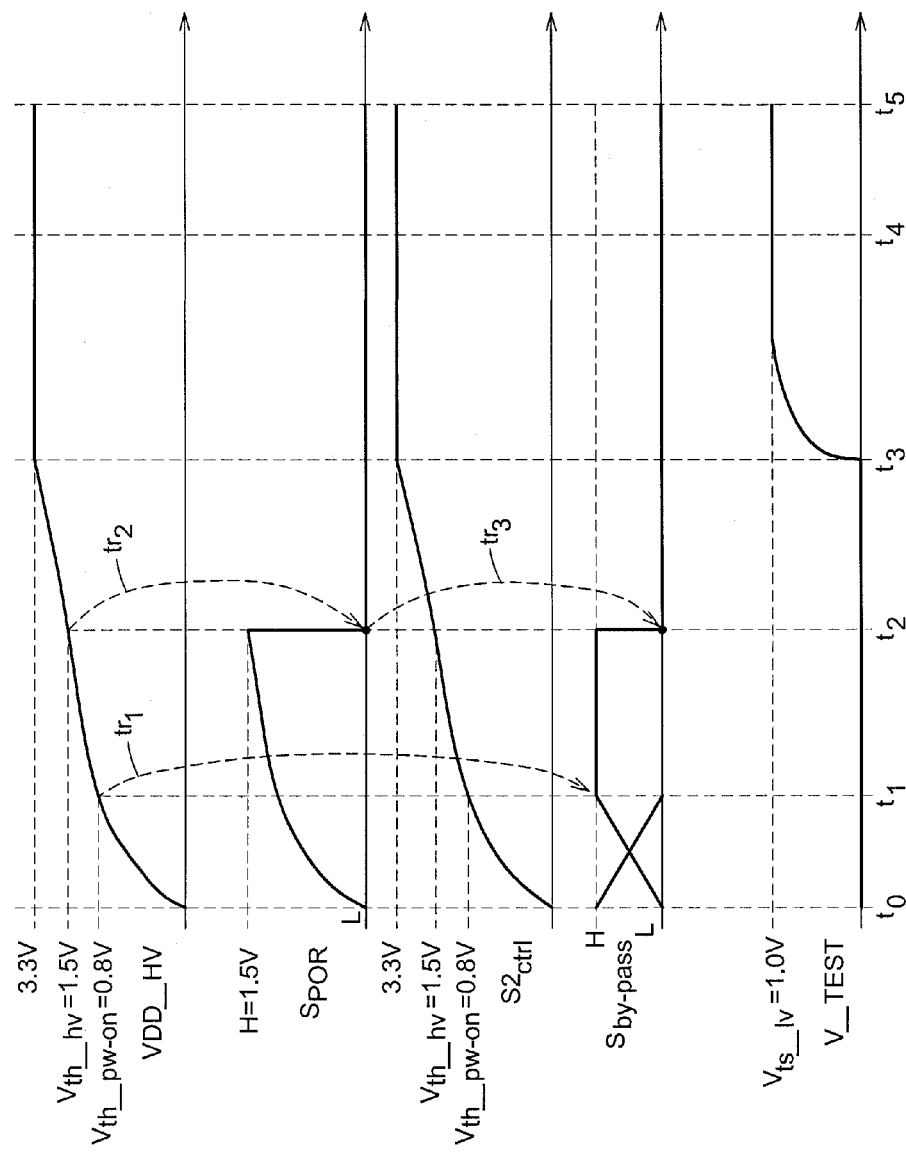
FIG. 6A schematically shows a possible trend of some signals of the Test system according to the first embodiment during a start-up phase of the test operation mode of the System-on-chip.

Referring to FIG. 6A, it shows a possible trend of the input high supply voltage VDD_HV, of the power-on-reset signal $S_{POR}$, of the second control signal $S2_{ctrl}$, of the by-pass signal $S_{by-pass}$ and of the test supply voltage V_TEST according to the first embodiment of the invention, during the start-up phase of the test operation mode comprised between time instants $t_0$ and $t_5$ wherein the System-on-chip 2 is supplied for the first time or is supplied again after a switch-off.

It is possible to note that:

the trend of input high supply voltage VDD_HV is increasing from 0 V to its nominal value, which is supposed equal to 3.3 V;

the trend of the power-on-reset signal $S_{POR}$ is equal to the trend of input high supply voltage VDD_HV during the time period comprised between $t_0$ and $t_2$;

the trend of the second control signal $S2_{ctrl}$ is equal to the trend of input high supply voltage VDD_HV during the entire time period of the test operation mode;

when the input high supply voltage VDD_HV reaches at time $t_1$ the value of the power-on threshold $V_{th\_pw-on}$ (which is supposed equal to 0.8 V), the by-pass signal $S_{by-pass}$ assumes an high logic value H (see the dashed arrow $tr_1$);

when the input high supply voltage VDD_HV reaches at time $t_2$ the value of the high voltage threshold $V_{th\_hv}$ (which is supposed equal to 1.5 V), the power-on-reset signal $S_{POR}$ has a transition to the low logic value L (see the dashed arrow $tr_2$), which in turn causes a transition of the by-pass signal $S_{by-pass}$ to the low logic value L (see the dashed arrow $tr_3$);

when the input high supply voltage VDD_HV reaches at time $t_3$ its nominal value (which is supposed equal to 3.3 V), the test supply voltage V_TEST has a trend increasing from 0 V to a test value $V_{ts\_lv}$ (which is supposed equal to 1.0 V) different from the nominal value (which is supposed equal to 1.2 V) of the output low supply voltage VDD_LV.

Figure 6B:
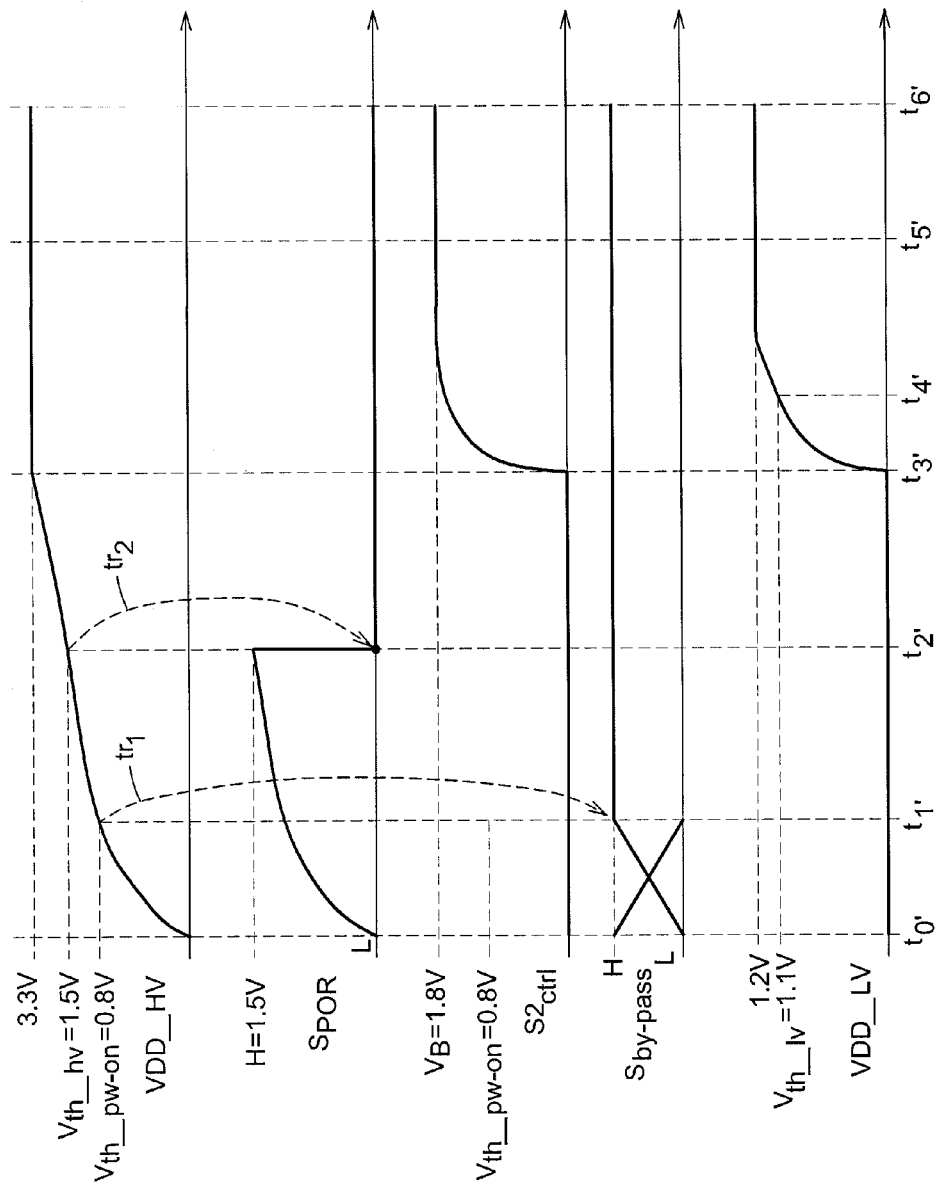
FIG. 6B schematically shows a possible trend of some signals of the Test system according to the first embodiment during the start-up phase of the normal operation mode of the System-on-chip.

Referring to FIG. 6B, it shows a possible trend of the input high supply voltage VDD_HV, of the power-on-reset signal $S_{POR}$, of the second control signal $S2_{ctrl}$, of the by-pass signal $S_{by-pass}$ and of the output low supply voltage VDD_LV according to the first embodiment, during the start-up phase of the normal operation mode comprised between time instants $t_0'$ and $t_5'$ wherein the System-on-chip 2 is supplied for the first time.

It is possible to note that:

the trend of input high supply voltage VDD_HV is increasing from 0 V to its nominal value, which is supposed equal to 3.3 V;

the trend of the power-on-reset signal $S_{POR}$ is equal to the trend of input high supply voltage VDD_HV during the time period comprised between $t_0'$ and $t_2'$;

the second control signal $S2_{ctrl}$ is equal to 0 V due to the weak pull-down resistor $R_{pd}$ during the time period comprised between $t_0'$ and $t_3'$ and it has a trend increasing from 0 V to the bias voltage $V_B$ during the time period comprised between $t_3'$ and $t_5'$;

when the input high supply voltage VDD_HV reaches at time $t_1'$ the value of the power-on threshold $V_{th\_pw-on}$ (which is supposed equal to 0.8 V), the by-pass signal $S_{by-pass}$ assumes an high logic value H (see the dashed arrow $tr_1$) and this high logic value is maintained;

when the input high supply voltage VDD_HV reaches at time $t_2'$ the value of the high voltage threshold $V_{th\_hv}$ (which is supposed equal to 1.5 V), the power-on-reset signal $S_{POR}$ has a transition to the low logic value L (see the dashed arrow $tr_2$) and this low logic value L is maintained;

when the input high supply voltage VDD_HV reaches at time $t_3'$ its nominal value (which is supposed equal to 3.3 V), the output low supply voltage VDD_LV has a trend increasing from 0 V to its nominal value (which is supposed equal to 1.2 V).

Referring to FIGS. 1, 2, 3A, 3B, 5 and 6A, it will be described hereinafter the operation of the Test system 1 according to the first embodiment during the start-up phase of the test operation mode of the System-on-chip 2.

For the purpose of explanation, it is supposed that the power-on threshold value $V_{th\_pw-on}$ is equal to 0.8 V, that the high voltage threshold $V_{th\_hv}$ is equal to 1.5 V, that the nominal value of the input high supply voltage VDD_HV is equal to 3.3 V, that the nominal value of the output low supply voltage VDD_LV is equal to 1.2 V and that the test value $V_{ts\_lv}$ of the test supply voltage V_TEST is equal to 1.0 V.

Moreover, during the time period comprised between $t_0$ and $t_2$ the Power-on-reset module 31 receives the input high supply voltage VDD_HV and generates the power-on-reset signal $S_{POR}$ equal to input high supply voltage VDD_HV.

Figure 3A:
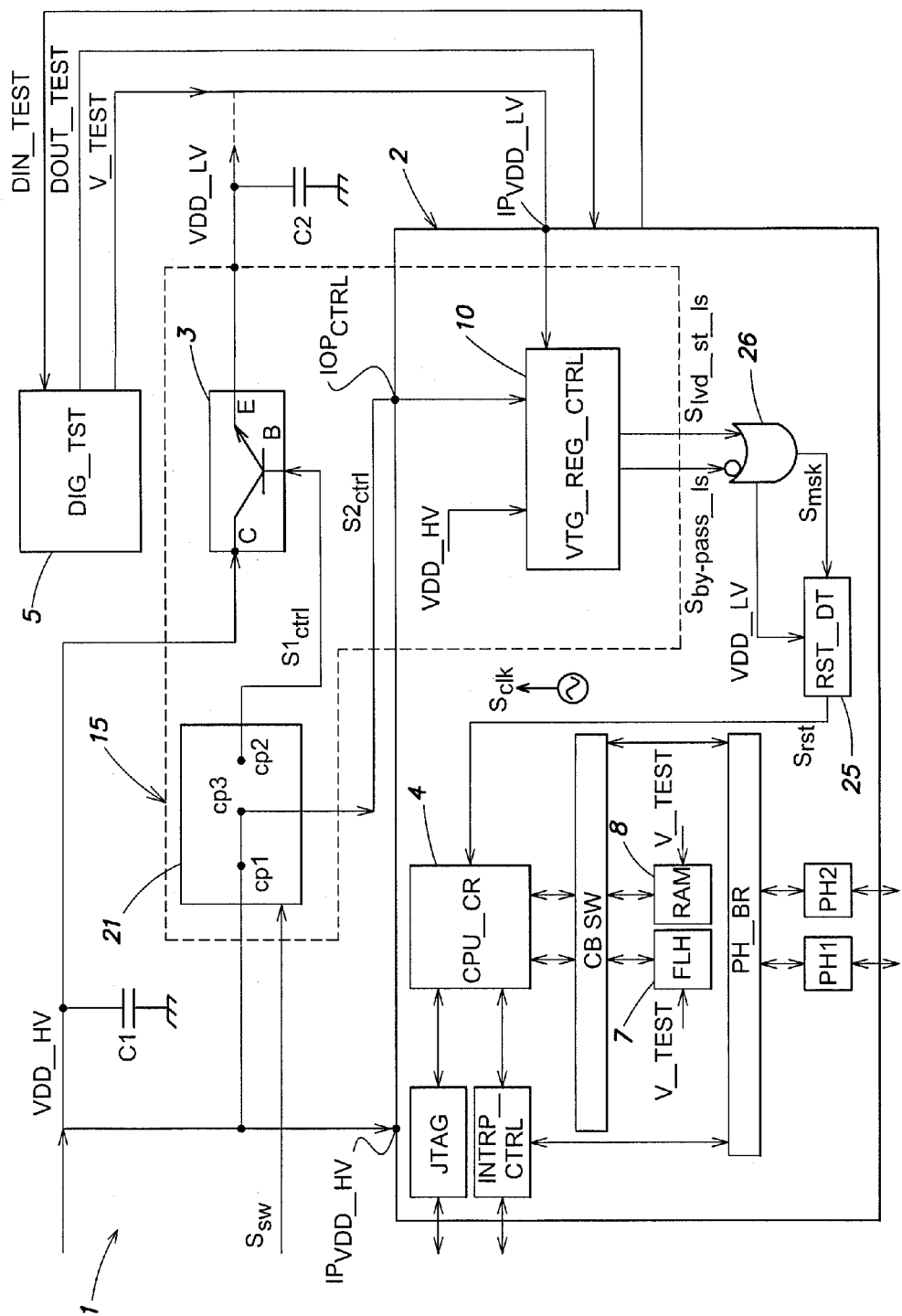
FIGS. 3A and 3B schematically show the Test system and the Voltage regulator Controller respectively according to the first embodiment during a test operation mode.
Figure 3B:
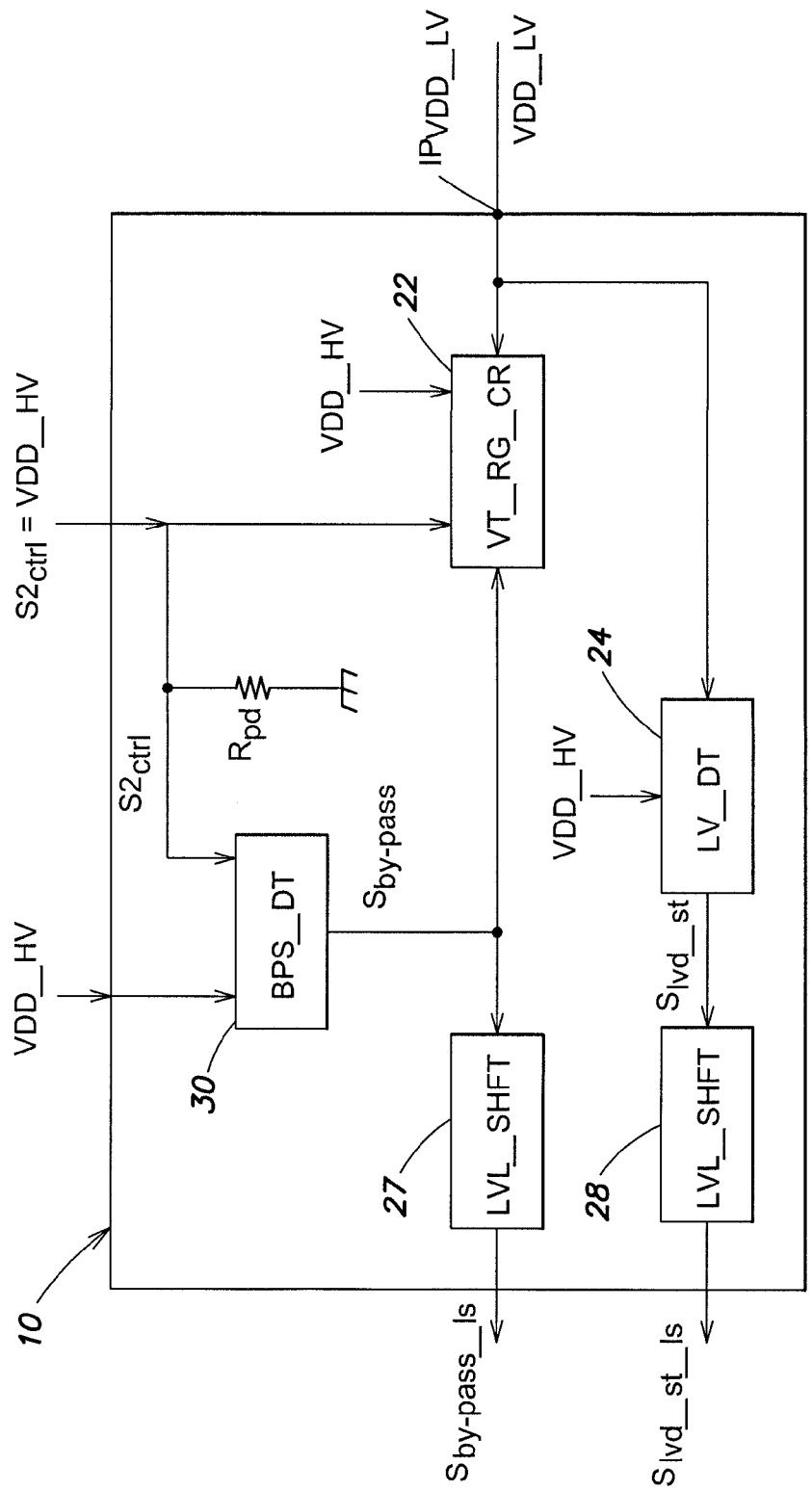

During the test operation mode the switch 21 receives the switch signal $S_{sw}$ having a logic value (for example, high) which causes the connection point cp3 of the switch 21 to be connected to the connection point cp1, as shown in FIG. 3A, so that the second control signal $S2_{ctrl}$ is always equal to the input high supply voltage VDD_HV. Since during the test operation mode the connection point cp2 is floating, the control terminal B of the power transistor 3 is also floating, the first control signal $S1_{ctrl}$ have undefined values and thus the power transistor 3 is open.

Starting Time $t_0$

At the starting time $t_0$ it occurs the start-up of the System-on-chip 2, that is the System-on-chip 2 is supplied for the first time (for example, it's supplied for the first time after mounting on a test board 1 or on a test machine operating in the manufacturer plant, before selling) or the System-on-chip 2 is supplied again after a switch-off: therefore the System-on-chip 2 receives the input high supply voltage VDD_HV starting from 0 V.

Since at the starting time $t_0$ the System-on-chip 2 is supplied for the first time, the input capacitor C1 and the output capacitor C2 are discharged and thus the values of the input high supply voltage VDD_HV and of the output low supply voltage VDD_LV are equal to 0 V.

Time Period Between $t_0$ (Included) and $t_1$ ($t_1$ Excluded)

In a time period comprised between $t_0$ (included) and $t_1$ (excluded) the System-on-chip 2 receives the input high supply voltage VDD_HV having a trend increasing from 0 V to the power-on threshold value $V_{th\_pw-on}$=0.8 V (excluded).

The Voltage regulator Controller 10 receives the input high supply voltage VDD_HV having the increasing trend: since the connection point cp3 is connected to the connection point cp1, the second control signal $S2_{ctrl}$ is equal to the input high supply voltage VDD_HV and thus also the second control signal $S2_{ctrl}$ has the same trend increasing from 0 V to the power-on threshold value $V_{th\_pw-on}$=0.8 V (excluded).

The By-pass detector 30 is supplied by the input high supply voltage VDD_HV having the trend increasing from 0 V to $V_{th\_pw-on}$=0.8 V (excluded), which has voltage values which are not sufficient to allow the correct operation of the digital logic composing the By-pass detector 30 (inverter logic gate 35, AND logic gate 34, NAND logic gate 33, Flip-flop 32, OR logic gate 36): therefore the By-pass detector 30 generates the by-pass signal $S_{by-pass}$ having undefined logic values (which is schematically indicated in FIG. 5 with 'X') and thus also the level shifted by-pass signal $S_{by-pass\_ls}$ has undefined logic values. Moreover, during the time period between $t_0$ and $t_1$ the Power-on-reset module 31 receives the input high supply voltage VDD_HV having the trend increasing from 0 V to $V_{th\_pw-on}$=0.8 V (excluded) and generates therefrom the power-on-reset signal $S_{POR}$ equal to input high supply voltage VDD_HV, thus also the power-on-reset signal $S_{POR}$ has the same trend increasing from 0 V to $V_{th\_pw-on}$=0.8 V (excluded).

Since at the starting time $t_0$ the output capacitor C2 is discharged, the power transistor 3 is off during the time period between $t_0$ and $t_1$ and the Digital Tester 5 is maintained disabled by the test operator during the time period between $t_0$ and $t_1$, the voltage value of the terminal E during the time period between $t_0$ and $t_1$ is maintained at 0 V and thus also the value of the output low supply voltage VDD_LV is equal to 0 V.

Time $t_1$

At time $t_1$ the value of the input high supply voltage VDD_HV reaches the power-on threshold value $V_{th\_pw-on}$=0.8 V.

At time $t_1$ the test operator maintains the Digital Tester 5 disabled.

The Voltage regulator Controller 10 receives the input high supply voltage VDD_HV=$V_{th\_pw-on}$=0.8 V: since the connection point cp3 is connected to the connection point cp1, the second control signal $S2_{ctrl}$=0.8 V.

Since the connection point cp2 is floating, the control terminal B of the power transistor 3 is also floating, the first control signal $S1_{ctrl}$ has undefined values and thus the power transistor 3 is open. Since the power transistor 3 is open, the Digital Tester 5 is disabled and the output capacitor C2 is discharged, the voltage value of the terminal E at time $t_1$ is maintained at 0 V and thus also the value of the output low supply voltage VDD_LV is equal to 0 V.

The By-pass detector 30 is supplied by the input high supply voltage VDD_HV=$V_{th\_pw-on}$=0.8 V, which is sufficient to allow the correct operation of the digital logic composing the By-pass detector 30 and thus the By-pass detector 30 generates the by-pass signal $S_{by-pass}$ having a valid logic value.

More specifically, the Power-on-reset module 31 receives the input high supply voltage VDD_HV having a value equal to $V_{th\_pw-on}$=0.8 V and generates therefrom the power-on-reset signal $S_{POR}$ having a voltage value equal to 0.8 V.

The NAND logic gate 33 receives the power-on-reset signal $S_{POR}$ having a value equal to $V_{th\_pw-on}$=0.8 V which is detected as an high logic value, receives the second control signal $S2_{ctrl}$ having a value equal to $V_{th\_pw-on}$=0.8 V which is detected as an high logic value and generates therefrom the clear signal $S_{cl}$ having a low logic value.

The flip-flop 32 receives at the reset terminal R the clear signal $S_{cl}$ having the low logic value and generates therefrom the status signal $S_q$ having a low logic value.

The OR logic gate 36 receives the power-on-reset signal $S_{POR}=0.8$ V which is detected as an high logic value, receives the status signal $S_q$ having the low logic value and generates therefrom the by-pass signal $S_{by\text{-}pass}$ having an high logic value indicating the enable status of the Voltage regulator 15.

The second level shifter 27 receives the by-pass signal $S_{by\text{-}pass}$ having the high logic value, is supplied by the output low voltage signal VDD_LV equal to 0 V and generates the level shifted by-pass signal $S_{by\text{-}pass}$ having an undefined logic value.

The Voltage regulator circuit 22 receives the by-pass signal $S_{by\text{-}pass}$ having the high logic value and receives the input high supply voltage VDD_HV=0.8 V which is not sufficient to allow the correct operation of the components composing the Voltage regulator circuit 22, thus the Voltage regulator circuit 22 is switched-off and its input/output terminal is floating.

The Low voltage detector 24 is supplied by the input high supply voltage VDD_HV=0.8 V, which is not sufficient to allow the correct operation of the components composing the Low voltage detector 24, thus the low voltage status signal $S_{lvd\_st}$ has a low logic value indicating that the value of the output low supply voltage VDD_LV is too small to allow a correct operation of the electronic components supplied by the output low supply voltage VDD_LV.

The first level shifter 28, the OR logic gate 26 and the Reset detector 25 are supplied by the output low supply voltage VDD_LV=0 V, which is not sufficient to allow their operation: in this case the first level shifter 28, the OR logic gate 26 and the Reset detector 25 are in a pre-defined status and generate at the respective output terminals signals having a low logic value.

In particular, the first level shifter 28 generates the level shifted low voltage status signal $S_{lvd\_st\_ls}$ having a low logic value.

The OR logic gate 26 generates the masked signal $S_{msk}$ having a low logic value which allows the transmission of the low logic value of the level shifted low voltage status signal $S_{lvd\_st\_ls}$ towards the Reset detector 25 (and thus it allows the transmission of the low logic value of the low voltage status signal $S_{lvd\_st}$).

The Reset detector 25 generates the reset signal $S_{rst}$ having a low logic value which performs the reset of the CPU core 4.

The CPU core 4 receives the reset signal $S_{rst}$ having the low logic value and thus it's in the reset mode.

Time Period Between $t_1$ and $t_2$ ($t_1$ and $t_2$ Excluded)

In a time period comprised between $t_1$ and $t_2$ ($t_1$ and $t_2$ excluded) the System-on-chip 2 receives the input high supply voltage VDD_HV having a trend increasing from 0.8 V to the high-voltage threshold value $V_{th\_hv}=1.5$ V (excluded). The operation of the System-on-chip 2 is similar to the one previously described at time $t_1$. In particular, the power-on-reset signal $S_{POR}$ is equal to input high supply voltage VDD_HV, thus also the power-on-reset signal $S_{POR}$ has the same trend increasing from 0.8 V to 1.5 V which is detected as an high logic value and thus the by-pass signal $S_{by\text{-}pass}$ maintains the high logic value.

Since the power transistor 3 is open, the Digital Tester 5 is disabled and the output capacitor C2 is discharged, the voltage value of the terminal E in the time period between $t_1$ and $t_2$ is maintained at 0 V and thus also the value of the output low supply voltage VDD_LV is equal to 0 V.

Time $t_2$

At time $t_2$ the value of the input high supply voltage VDD_HV reaches the high-voltage threshold value $V_{th\_hv}=1.5$ V.

At time $t_2$ the test operator continues to maintain the Digital Tester 5 disabled.

The Voltage regulator Controller 10 receives the input high supply voltage VDD_HV=$V_{th\_hv}=1.5$ V: since the connection point cp3 is connected to the connection point cp1, the second control signal $S2_{ctrl}=1.5$ V.

Since the power transistor 3 is open, the Digital Tester 5 is disabled and the output capacitor C2 is discharged, the voltage value of the terminal E at time $t_2$ is maintained at 0 V and thus also the value of the output low supply voltage VDD_LV is equal to 0 V.

The Power-on-reset module 31 receives the input high supply voltage VDD_HV=$V_{th\_hv}=1.5$ V and generates therefrom the power-on-reset signal $S_{POR}$ having a transition from the high logic value H to the low logic value L.

The NAND logic gate 33 receives the power-on-reset signal $S_{POR}$ having the low logic value, receives the second control signal $S2_{ctrl}=1.5$ V which is detected as an high logic value and generates therefrom the clear signal $S_{cl}$ having an high logic value.

The inverter logic gate 35 receives the status signal $S_q$ having the low logic value and generates therefrom the inverted signal $S_{inv}$ having an high logic value.

The AND logic gate 34 receives the inverted signal $S_{inv}$ having the high logic value, receives the second control signal $S2_{ctrl}=1.5$ V which is detected as an high logic value and generates therefrom the preset signal $S_{pr}$ having an high logic value.

The flip-flop 32 receives at the reset terminal R the clear signal $S_{cl}$ having the high logic value, receives at the set terminal S the preset signal $S_{pr}$ having the high logic value and generates therefrom the status signal $S_q$ which maintains the actual value, that is the low logic value.

The OR logic 36 receives the power-on-reset signal $S_{POR}$ having the low logic value, receives the status signal $S_q$ having the low logic value and generates therefrom the by-pass signal $S_{by\text{-}pass}$ having a low logic value, which activates the test operation mode of the System-on-chip 2 and performs the by-pass of the Voltage regulator 15.

The second level shifter 27 is supplied by the output low supply voltage VDD_LV, which is not sufficient to allow its operation: in this case the second level shifter 27 generates the level shifted by-pass signal $S_{by\text{-}pass\_ls}$ having a low logic value.

Therefore the transition of the power-on-reset signal $S_{POR}$ to the low logic value has triggered a transition of the by-pass signal $S_{by\text{-}pass}$ to the low logic value, thus activating the test operation mode of the System-on-chip 2 and performing the by-pass of the Voltage regulator 15: this will enable the Digital Tester 5 to assign (during the time period comprised between $t_3$ and $t_5$) the value of the test supply voltage V_TEST over the input pin $IP_{VDD\_LV}$.

The Voltage regulator circuit 22 is supplied by the input high supply voltage VDD_HV=1.5 V which is sufficient to allow the correct operation of the components composing the Voltage regulator circuit 22; since the Voltage regulator circuit 22 further receives the by-pass signal $S_{by\text{-}pass}$ having the low logic value which indicates the by-pass status of the Voltage regulator 15, the Voltage regulator circuit 22 continues to be switched-off and its input/output terminal is operating as an input terminal receiving the second control signal $S2_{ctrl}=1.5$ V.

The Low voltage detector 24 is supplied by the input high supply voltage VDD_HV=1.5 V, it receives the output low supply voltage VDD_LV=0 V and detects that the value of the output low supply voltage VDD_LV is smaller than the value of low voltage threshold $V_{th\_lv}=1.1$ V: therefore the Low voltage detector 24 generates the low voltage status signal $S_{lvd\_st}$ having a low logic value indicating that the value of the output low supply voltage VDD_LV is too small to allow a correct operation of the electronic components supplied by the output low supply voltage VDD_LV.

The first level shifter 28, the OR logic gate 26 and the Reset detector 25 continues to be supplied by the output low supply voltage VDD_LV=0 V, which is not sufficient to allow their operation.

The first level shifter 28 continues to generate the level shifted low voltage status signal $S_{lvd\_st\_ls}$ having the low logic value.

The OR logic gate 26 continues to generate the masked signal $S_{msk}$ having the low logic value which allows the transmission of the low logic value of the level shifted low voltage status signal $S_{lvd\_st\_ls}$ towards the Reset detector 25 (and thus it allows the transmission of the low logic value of the low voltage status signal $S_{lvd\_st}$).

The Reset detector 25 generates the reset signal $S_{rst}$ having the low logic value, which maintains the reset of the CPU core 4.

The CPU core 4 receives the reset signal $S_{rst}$ having the low logic value and the CPU core 4 continues to be in the reset mode.

Time Period Between $t_2$ ($t_2$ Excluded) and $t_3$ ($t_3$ Excluded)

In a time period comprised between $t_2$ ($t_2$ excluded) and $t_3$ ($t_3$ excluded) the System-on-chip 2 receives the input high supply voltage VDD_HV having a trend increasing from 1.5 V to the nominal value of the input high voltage supply VDD_HV which is supposed equal to 3.3 V (excluded). The operation of the System-on-chip 2 is the same as the one previously described at time $t_2$, thus the following behavior occurs:

the power-on-reset signal $S_{POR}$ has the low logic value;
the second control signal $S2_{ctrl}$ has the same trend of the input high supply voltage VDD_HV increasing from 1.5 V to 3.3 V;
the by-pass signal $S_{by-pass}$ has the low logic value, which maintains the Voltage regulator 15 by-passed;
the low voltage status signal $S_{lvd\_st}$ has the low logic value;
the masked signal $S_{msk}$ has the low logic value;
the reset signal $S_{rst}$ has the low logic value;
the CPU core 4 is in the reset mode.

Since the power transistor 3 is open, the Digital Tester 5 is disabled and the output capacitor C2 is discharged, the voltage value of the terminal E in the time period between $t_2$ and $t_3$ is maintained at 0 V and thus also the value of the output low supply voltage VDD_LV is equal to 0 V.

Time $t_3$

At time $t_3$ the value of the input high supply voltage VDD_HV reaches its nominal value equal to 3.3 V.

The Voltage regulator Controller 10 receives the input high supply voltage VDD_HV=3.3 V: since the connection point cp3 is connected to the connection point cp1, the second control signal $S2_{ctrl}$=3.3 V.

The Power-on-reset module 31 receives the input high supply voltage VDD_HV having the value equal to 3.3 V and continues to generate therefrom the power-on-reset signal $S_{POR}$ having the low logic value. The NAND logic gate 33 continues to receive the power-on-reset signal $S_{POR}$ having the low logic value, continues to receive the second control signal $S2_{ctrl}$ having the high logic value and continues to generate therefrom the clear signal $S_{cl}$ having the high logic value. The flip-flop 32 continues to receive at the reset terminal R the clear signal $S_{cl}$ having the high logic value and at the set terminal S the preset signal $S_{pr}$ having the high logic value and continues to generate therefrom the status signal $S_q$ having the low logic value.

The OR logic 36 continues to receive the power-on-reset signal $S_{POR}$ having the low logic value, continues to receive the status signal $S_q$ having the low logic value and continues to generate therefrom the by-pass signal $S_{by-pass}$ having the low logic value indicating the by-pass status of the Voltage regulator 15.

Since the by-pass signal $S_{by-pass}$ maintains the low logic value, the Voltage regulator 15 continues to be by-passed.

At time $t_3$ the test operator enables the Digital Tester 5, which starts to generate the test supply voltage V_TEST over the output voltage test terminal, which drives the input pin $IP_{VDD\_LV}$ with the test supply voltage V_TEST having a trend increasing from the value 0 V at time $t_3$ to the test value $V_{ts\_lv}$=1.0 V at time $t_4$ and thus the value of the test supply voltage V_TEST starts to increase from 0 V to 1.0 V.

The Voltage regulator circuit 22 continues to receive the $S_{by-pass}$ having the low logic value indicating the by-pass status of the Voltage regulator 15 and receives the input high supply voltage VDD_HV=3.3 V; since the $S_{by-pass}$ has the low logic value which indicates the by-pass status of the Voltage regulator 15, the Voltage regulator circuit 22 continues to be switched-off and its input/output terminal is operating as an input terminal receiving the second control signal $S2_{ctrl}$=3.3 V.

The Low voltage detector 24 is supplied by the input high supply voltage VDD_HV=3.3 V, it receives the output low supply voltage VDD_LV=0 V and detects that the value of the output low supply voltage VDD_LV is smaller than the value of low voltage threshold $V_{th\_lv}$=1.1 V: therefore the Low voltage detector 24 generates the low voltage status signal $S_{lvd\_st}$ having a low logic value indicating that the value of the output low supply voltage VDD_LV is too small to allow a correct operation of the electronic components supplied by the output low supply voltage VDD_LV.

The first level shifter 28, the OR logic gate 26 and the Reset detector 25 continues to be supplied by the output low supply voltage VDD_LV=0 V, which is not sufficient to allow their operation.

The first level shifter 28 continues to generate the level shifted low voltage status signal $S_{lvd\_st\_ls}$ having the low logic value.

The OR logic gate 26 continues to generate the masked signal $S_{msk}$ having the low logic value which allows the transmission of the low logic value of the level shifted low voltage status signal $S_{lvd\_st\_ls}$ towards the Reset detector 25 (and thus it allows the transmission of the low logic value of the low voltage status signal $S_{lvd\_st}$).

The Reset detector 25 generates the reset signal $S_{rst}$ having the low logic value, which maintains the reset of the CPU core 4.

The CPU core 4 receives the reset signal $S_{rst}$ having the low logic value and the CPU core 4 continues to be in the reset mode.

Time Period Between $t_3$ and $t_4$ (Excluded)

During a time period comprised between $t_3$ and $t_4$ (excluded) the System-on-chip 2 receives the input high supply voltage VDD_HV substantially equal to 3.3 V. The operation of the System-on-chip 2 is similar to the one previously described at time $t_3$, thus the following behavior occurs:

the power-on-reset signal $S_{POR}$ has the low logic value;
the by-pass signal $S_{by-pass}$ has the low logic value;
the low voltage status signal $S_{lvd\_st}$ has the low logic value;
the masked signal $S_{msk}$ has the low logic value;
the reset signal $S_{rst}$ has the low logic value;
the CPU core 4 is in the reset mode.

Moreover, since the by-pass signal $S_{by-pass}$ maintains the low logic value, the Voltage regulator 15 continues to be by-passed: this allows the Digital Tester 5 to assign the value of the test supply voltage V_TEST over the input pin $IP_{VDD\_LV}$.

In particular, the Digital tester 5 generates the test supply voltage V_TEST having a trend increasing from 0 V to a test value $V_{ts\_lv}$ (excluded) which is supposed to be equal to 1.0 V (thus smaller than the nominal value=1.2 V of the output low supply voltage VDD_LV) and thus the voltage value at the input pin $IP_{VDD\_LV}$ has a trend increasing from 0 V to 1.0 V (excluded).

Time $t_4$

At time $t_4$ the System-on-chip 2 receives the input high supply voltage VDD_HV substantially equal to 3.3 V. The operation of the System-on-chip 2 is similar to the one previously described in the time period between $t_3$ and $t_4$ and the following behavior occurs:

the power-on-reset signal $S_{POR}$ maintains the low logic value;

the by-pass signal $S_{by-pass}$ maintains the low logic value;

the low voltage status signal $S_{lvd\_st}$ maintains the low logic value;

the OR logic gate 26 generates the masked signal $S_{msk}$ having an high logic value which masks the transmission of the low logic value of the level shifted low voltage status signal $S_{lvd\_st\_ls}$ towards the Reset detector 25 (and thus it masks the transmission of the low logic value of the low voltage status signal $S_{lvd\_st}$): this allows to discard the indication that the output low supply voltage VDD_LV is too low and allows to perform the test of the operation of one or more electronic components supplied by the test supply voltage V_TEST generated by the output voltage test terminal of the Digital Tester 5;

the Reset detector 25 generates the reset signal $S_{rst}$ having the high logic value, which prevents the reset of the CPU core 4;

the CPU core 4 is in the normal mode.

Since the by-pass signal $S_{by-pass}$ maintains the low logic value, the Voltage regulator 15 continues to be by-passed: this allows the Digital Tester 5 to assign the value of the test supply voltage V_TEST over the input pin $IP_{VDD\_LV}$. In particular, the Digital Tester 5 generates the test value $V_{ts\_lv}$=1.0 V and thus the test supply voltage V_TEST=1.0 V. Moreover, the Digital Tester 5 performs the test of the operation of an electronic component inside the System-on-chip 2 by supplying the electronic component under test with the test supply voltage V_TEST=$V_{ts\_lv}$=1.0 V. For example, the Digital Tester 5 performs the test of the operation of the Flash memory 7 which is supplied by the test supply voltage V_TEST=$V_{ts\_lv}$=1.0 V.

Time Period Between $t_4$ and $t_5$

During a time period comprised between $t_4$ and $t_5$ the by-pass signal $S_{by-pass}$ maintains the low logic value, the Voltage regulator 15 continues to be by-passed, the CPU core 4 maintains the normal mode and the Digital Tester 5 continues to perform the test of the operation of the Flash memory 7 by supplying the Flash memory 7 with the test supply voltage V_TEST=$V_{ts\_lv}$=1.0 V. The values of the signals VDD_HV, $S_{POR}$, $S2_{ctrl}$, $S_{by-pass}$ are the same as the one previously described at time $t_4$.

Referring to FIGS. 1, 2, 4A, 4B, 5 and 6B, it will be described hereinafter the operation of the Test system 1 according to the first embodiment during the start-up phase of the normal operation mode.

For the purpose of explanation, it is supposed that the power-on threshold value $V_{th\_pw-on}$ is equal to 0.8 V, that the high voltage threshold $V_{th\_hv}$ is equal to 1.5 V, that the nominal value of the input high supply voltage VDD_HV is equal to 3.3 V, that the nominal value of the output low supply voltage VDD_LV is equal to 1.2 V and that the bias value $V_B$ is equal to 1.8 V.

Figure 4A:
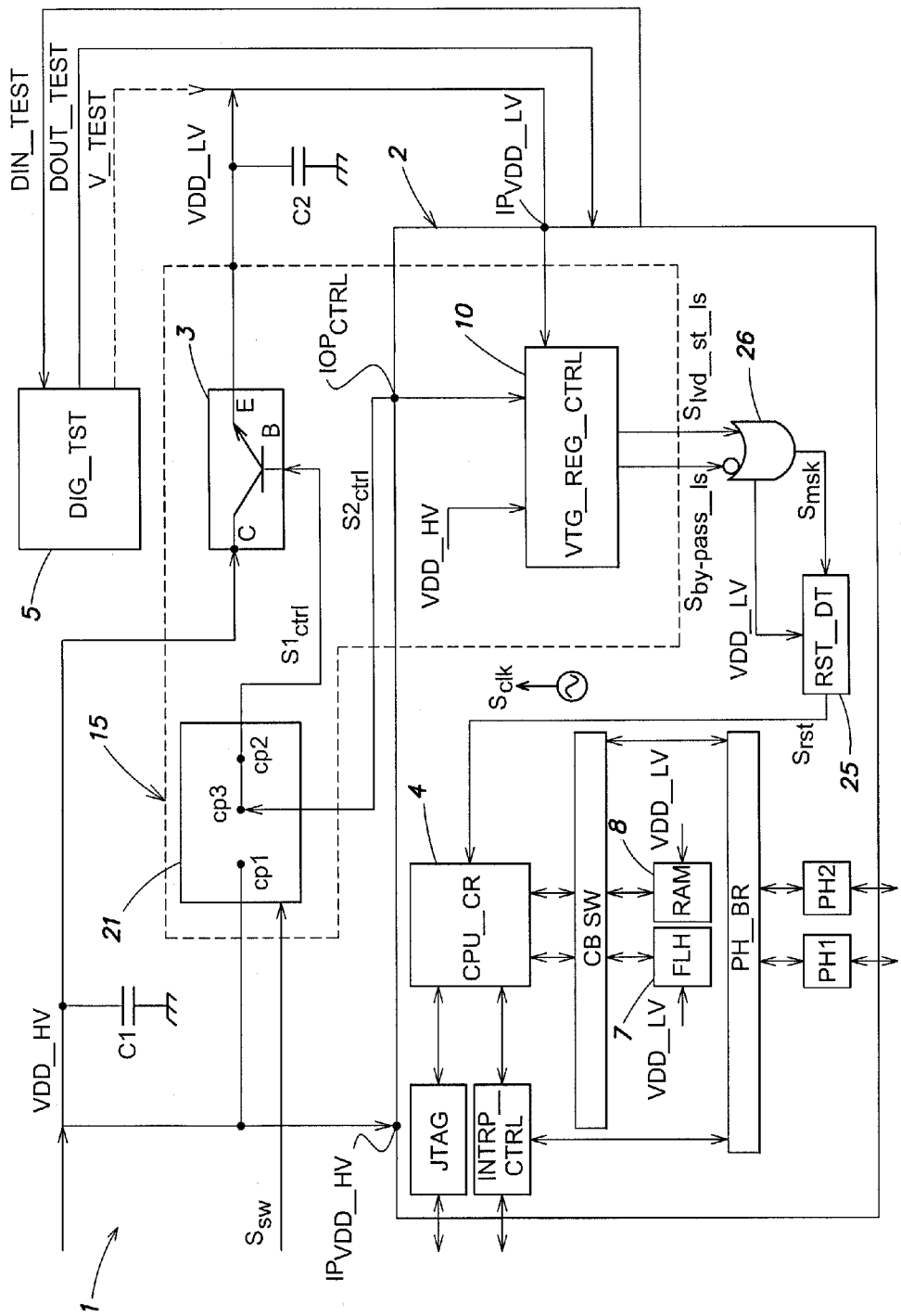
FIGS. 4A and 4B schematically show the Test system and the Voltage regulator Controller respectively according to the first embodiment during a normal operation mode.
Figure 4B:
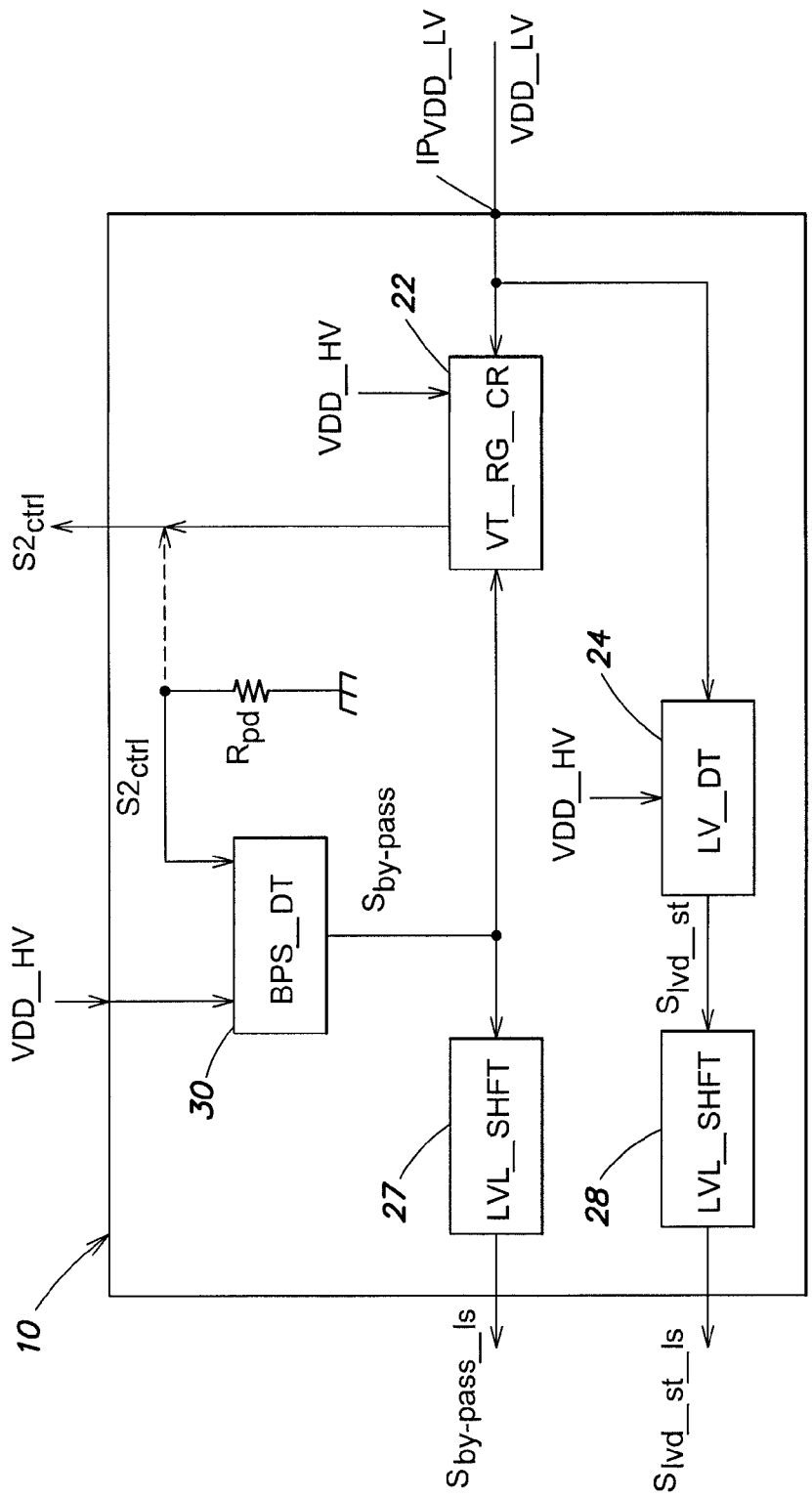

During the normal operation mode the switch 21 receives the switch signal $S_{sw}$ having a logic value (for example, low) which causes the connection point cp3 of the switch 21 to be connected to the connection point cp2, as shown in FIG. 4A, so that the second control signal $S2_{ctrl}$ is always equal to the first control signal $S1_{ctrl}$ and so that the control terminal B of the power transistor 3 is driven by the output terminal of the Voltage regulator Controller 10 which generates the second control signal $S2_{ctrl}$. Moreover, the test operator maintains the Digital Tester 5 disabled during the time period comprised between $t_0'$ and $t_3'$ and during this time period its output voltage test terminal is floating.

Time Period Between $t_0'$ and $t_2'$ ($t_2'$ Excluded)

At the starting time $t_0'$ it occurs the start-up of the System-on-chip 2, that is the System-on-chip 2 is supplied for the first time (for example, it's supplied for the first time after mounting on a PCB of an electronic device operating for example in the automotive field such as in a car or it's supplied for the first time after mounting on a test board 1 or on a test machine operating in the manufacturer plant before selling) or the System-on-chip 2 is supplied again after a switch-off: therefore the System-on-chip 2 receives the input high supply voltage VDD_HV having a trend increasing from 0 V to 1.5 V.

The operation of the System-on-chip 2 during the time period comprised between $t_0'$ and $t_2'$ is equal to the operation of the System-on-chip 2 in the test operation mode during the time period comprised between $t_0$ and $t_2$ previously described, with the following differences.

The connection point cp3 is not connected to the connection point cp1 and the second control signal $S2_{ctrl}$ has not the same increasing trend of the input high supply voltage VDD_HV.

In this case, the connection point cp3 is connected to the connection point cp2 so that the value of the second control signal $S2_{ctrl}$ is equal to the value of the first control signal $S1_{ctrl}$. Specifically, during the time period comprised between $t_0'$ and $t_2'$ the weak pull-down resistor $R_{pd}$ drives the input/output terminal of the Voltage regulator Controller 10 (see the dashed line in FIG. 4B) and thus the value of the second control signal $S2_{ctrl}$ is equal to 0 V and also the value of the first control signal $S1_{ctrl}$ over the control terminal B of the power transistor 3 is equal to 0 V.

The power transistor 3 receives at the first terminal C the input high supply voltage VDD_HV having a trend increasing from 0 V to 1.5 V, receives at the control terminal B the first control signal $S1_{ctrl}$=0 V and thus the power transistor 3 is open. Therefore the voltage value of the second terminal E of the power transistor 3 is equal to 0 V and thus also the value of the output low supply voltage VDD_LV=0 V.

Moreover, the weak pull-down resistor $R_{pd}$ further drives the input terminal of the By-pass detector 30 with the second control signal $S2_{ctrl}$=0 V. Therefore the By-pass detector 30 receives the input high supply voltage VDD_HV having the trend increasing from 0 V to 1.5 V, receives the second control signal $S2_{ctrl}$=0 V and generates therefrom the by-pass signal $S_{by-pass}$ having the high logic value indicating the enable status of the Voltage regulator 15. Therefore the pull-down resistor $R_{pd}$ allows to enable the operation of the Voltage regulator 15 at the start-up of the normal operation mode.

Time $t_2'$

At time $t_2'$ the value of the input high supply voltage VDD_HV reaches the high-voltage threshold value $V_{th\_hv}$=1.5 V.

The Power-on-reset module 31 receives the input high supply voltage VDD_HV=$V_{th\_hv}$=1.5 V and generates therefrom the power-on-reset signal $S_{POR}$ having a transition from the high logic value H to the low logic value L.

The NAND logic gate 33 receives the power-on-reset signal $S_{POR}$ having the low logic value, receives the second control signal $S2_{ctrl}$ having a low logic value (due to the weak pull-down resistor $R_{pd}$) and generates therefrom the clear signal $S_{ctrl}$ having an high logic value.

The AND logic gate 34 receives the second control signal $S2_{ctrl}$ having the low logic value and generates therefrom the preset signal $S_{pr}$ having a low logic value.

The flip-flop 32 receives at the reset terminal R the clear signal $S_{cl}$ having the high logic value, receives at the set terminal S the preset signal $S_{pr}$ having the low logic value and generates therefrom the status signal $S_q$ having an high logic value.

The OR logic 36 receives the power-on-reset signal $S_{POR}$ having the low logic value, receives the status signal $S_q$ having the high logic value and generates therefrom the by-pass signal $S_{by-pass}$ having a high logic value.

Therefore differently from the test operation mode, in the normal operation mode the transition of the power-on-reset signal $S_{POR}$ to the low logic value has not triggered a transition of the by-pass signal $S_{by-pass}$ to the low logic value, which is maintained at the high logic value, thus maintaining the Voltage regulator 15 enabled.

Again, at time $t_2$' the pull-down resistor $R_{pd}$ allows to avoid the by-pass of the Voltage regulator 15 and to maintain the Voltage regulator 15 enabled.

The Voltage regulator circuit 22 is supplied by the input high supply voltage VDD_HV=1.5 V which is sufficient to allow the correct operation of the components composing the Voltage regulator circuit 22; since the Voltage regulator circuit 22 further receives the by-pass signal $S_{by-pass}$ having the high logic value which indicates the enable status of the Voltage regulator 15, the Voltage regulator circuit 22 is switched-on and it starts to drive its input/output terminal at 0 V. Accordingly, the voltage values of the second control signal $S2_{ctrl}$ and of the first control signal $S1_{ctrl}$ are equal to 0 V, and the voltage value of the control terminal B of the power transistor 3 is also equal to 0 V.

The power transistor 3 receives at the first terminal C the input high supply voltage VDD_HV=1.5 V, receives at the control terminal B the first control signal $S1_{ctrl}$ having a voltage value equal to 0 V and thus the power transistor 3 is open. Therefore the voltage value of the second terminal E of the power transistor 3 is equal to 0 V and thus also the value of the output low supply voltage VDD_LV=0 V.

The Low voltage detector 24 is supplied by the input high supply voltage VDD_HV=1.5 V, it receives the output low supply voltage VDD_LV=0 V and detects that the value of the output low supply voltage VDD_LV is smaller than the value of the low voltage threshold $V_{th\_lv}$=1.1 V: therefore the Low voltage detector 24 generates the low voltage status signal $S_{lvd\_st}$ having a low logic value indicating that the value of the output low supply voltage VDD_LV is too small to allow a correct operation of the electronic components supplied by the output low supply voltage VDD_LV.

The first level shifter 28, the OR logic gate 26 and the Reset detector 25 continues to be supplied by the output low supply voltage VDD_LV=0 V, which is not sufficient to allow their operation.

The first level shifter 28 continues to generate the level shifted low voltage status signal $S_{lvd\_st\_ls}$ having a low logic value.

The OR logic gate 26 continues to generate the masked signal $S_{msk}$ having a low logic value which allows the transmission of the low logic value of the level shifted low voltage status signal $S_{lvd\_st\_ls}$ towards the Reset detector 25 (and thus it allows the transmission of the low logic value of the low voltage status signal $S_{lvd\_st}$).

The Reset detector 25 generates the reset signal $S_{rst}$ having a low logic value which performs the reset of the CPU core 4.

The CPU core 4 receives the reset signal $S_{rst}$ having the low logic value and the CPU core 4 is in the reset mode.

Time Period Between $t_2$' and $t_3$' ($t_3$' Excluded)

In a time period comprised between $t_2$' and $t_3$' ($t_3$' excluded) the System-on-chip 2 receives the input high supply voltage VDD_HV having a trend increasing from 1.5 V to the nominal value of the input high voltage supply which is supposed equal to 3.3 V. The operation of the System-on-chip 2 is the same as the one previously described at time $t_2$', thus the following behaviors occurs:
  the power-on-reset signal $S_{POR}$ has the low logic value;
  the second control signal $S2_{ctrl}$ is equal to 0 V;
  the by-pass signal $S_{by-pass}$ has the high logic value, which maintains the Voltage regulator 15 enabled;
  the low voltage status signal $S_{lvd\_st}$ has a low logic value;
  the masked signal $S_{msk}$ has the low logic value;
  the reset signal $S_{rst}$ has the low logic value which performs the reset of the CPU core 4;
  the CPU core 4 is in the reset mode;
  the value of the output low supply voltage VDD_LV is equal to 0 V.

The normal operation mode includes a transient phase comprised between $t_3$' and $t_5$' wherein the output low supply voltage VDD_LV gradually reaches its nominal value (in the example, 1.2 V) and includes a steady phase (from $t_5$') wherein the output low supply voltage VDD_LV is maintained at a substantially constant value (that is, its nominal value which is supposed equal to 1.2 V).

Time Period Between $t_3$' ($t_3$' Included) and $t_4$' ($t_4$' Excluded)

At time $t_3$' the System-on-chip 2 receives the input high supply voltage VDD_HV which has reached the nominal value, which is supposed to be equal to 3.3 V.

The Voltage regulator Controller 10 receives the input high supply voltage VDD_HV=3.3 V: since the connection point cp3 is connected to the connection point cp2 and the Voltage regulator circuit 22 is switched-on, the value of the second control signal $S2_{ctrl}$ is equal to the value at the input/output terminal of the Voltage regulator circuit 22 and the first control signal $S1_{ctrl}$ is equal to the second control signal $S2_{ctrl}$.

The operation of the By-pass detector 30 is the same as the one previously described at time $t_2$', thus the following behavior occurs:
  the power-on-reset signal $S_{POR}$ has the low logic value; the second control signal $S2_{ctrl}$ is equal to 0 V;
  the by-pass signal $S_{by-pass}$ has the high logic value, which maintains the Voltage regulator 15 enabled;
  the low voltage status signal $S_{lvd\_st}$ has a low logic value;
  the masked signal $S_{msk}$ has the low logic value;
  the reset signal $S_{rst}$ has the low logic value which performs the reset of the CPU core 4;
  the CPU core 4 is in the reset mode.

The output low supply voltage VDD_LV has a trend increasing from 0 V to $V_{th\_lv}$=1.1 V (excluded).

The Voltage regulator circuit 22 is supplied by the input high supply voltage VDD_HV=3.3 V and it receives the by-pass signal $S_{by-pass}$ having the high logic value indicating the enable status of the Voltage regulator 15: the Voltage regulator circuit 22 is switched-on, it generates over its input/output terminal the second control signal $S2_{ctrl}$ (equal to the first control signal $S1_{ctrl}$) having a trend increasing from 0 V to the bias value $V_B$=1.8 V. The first control signal $S1_{ctrl}$ (equal to the second control signal $S2_{ctrl}$) has the same trend increasing from 0 V to $V_B$=1.8 V, which drives the control terminal B of the power transistor 3 in order to close it and in order to start to regulate the output low supply voltage VDD_LV at a substantially constant voltage value, which is supposed to be equal to 1.2 V.

The power transistor 3 receives at the first terminal C the input high supply voltage VDD_HV=3.3 V, receives at the control terminal B the first control signal $S1_{ctrl}$ having the trend increasing from 0 V to the bias value $V_B$=1.8 V and thus the power transistor 3 is closed. The power transistor 3 generates at the second terminal E a voltage value having a trend increasing from 0 V to the nominal value 1.1 V and thus also the output low supply voltage VDD_LV has the same trend increasing from 0 V to 1.1 V.

Time $t_4'$

The operation at time $t_4'$ is similar to the one of the time period between $t_3'$ and $t_4'$ previously described, with the following differences.

The Low voltage detector 24 is supplied by the input high supply voltage VDD_HV=3.3 V, it receives the output low supply voltage VDD_LV=$V_{th\_lv}$=1.1 V and detects that the value of the output low supply voltage VDD_LV is equal to the value of the low voltage threshold $V_{th\_lv}$=1.1 V: therefore the Low voltage detector 24 generates the low voltage status signal $S_{lvd\_st}$ having an high logic value indicating that the value of the output low supply voltage VDD_LV is sufficient to allow a correct operation of the electronic components supplied by the output low supply voltage VDD_LV.

The first level shifter 28 receives the low voltage status signal $S_{lvd\_st}$ having the high logic value and generates therefrom the level shifted low voltage status signal $S_{lvd\_st\_ls}$ having a high logic value.

The OR logic gate 26 receives the inverted level shifted by-pass signal $\hat{S}_{by\text{-}pass\_ls}$ having a low logic value, receives the level shifted low voltage status signal $S_{lvd\_st\_ls}$ having the high logic value and generates therefrom the masked signal $S_{msk}$ having a high logic value which allows the transmission of the high logic value of the level shifted low voltage status signal $S_{lvd\_st\_ls}$ towards the Reset detector 25 (and thus it allows the transmission of the high logic value of the low voltage status signal $S_{lvd\_st}$).

The Reset detector 25 receives the masked signal $S_{msk}$ having the high logic value and generates therefrom the reset signal $S_{rst}$ having an high logic value which prevents the reset of the CPU core 4.

The CPU core 4 receives the reset signal $S_{rst}$ having the high logic value and the CPU core 4 is in the normal mode.

Time Period Between $t_4'$ and $t_5'$ ($t_5'$ Excluded)

During a time period comprised between $t_4'$ and $t_5'$ ($t_5'$ excluded) the Voltage regulator circuit 22 continues to drive the control terminal B of the power transistor 3 and the operation of the System-on-chip 2 is similar to the one previously described at time $t_4'$. In particular, the second control signal $S2_{ctrl}$ (which is equal to the first control signal $S1_{ctrl}$) has a trend increasing towards the bias value $V_B$=1.8 V, the output low voltage supply voltage has a trend increasing towards to the nominal value equal to 1.2 V and the Voltage regulator 15 is enabled.

Time $t_5'$

At time $t_5'$ the System-on-chip 2 reaches the steady condition.

The by-pass signal $S_{by\text{-}pass}$ maintains the high logic value, the System-on-chip 2 is in the normal operation mode and the Voltage regulator 15 is enabled.

The operation is similar to the one described previously at time $t_4'$, with the following differences.

The test operator enables the Digital tester 5, which performs the test of the functionality of the System-on-chip 2; in particular, the Digital Tester 5 generates and transmits over the output data terminals the output data test signals DOUT_TEST carrying the software program for performing the functionality test of the System-on-chip 2 and carrying the test patterns and the Digital Tester 5 receives from the input data terminals the input data test signal DIN_TEST carrying the results of the functionality test. The RAM memory 8 receives and stores the transmitted software program. Moreover, the RAM memory 8 stores the results of the functionality test and the Digital Tester 5 receives at the input data terminals the input data test signal DIN_TEST carrying the results of the functionality test read from the RAM memory 8.

The Voltage regulator circuit 22 is supplied by the input high supply voltage VDD_HV=3.3 V, it receives the by-pass signal $S_{by\text{-}pass}$ having the high logic value indicating the enable status of the Voltage regulator 15 and generates therefrom a voltage value of the second control signal $S2_{ctrl}$ (equal to the first control signal $S1_{ctrl}$) having the bias value $V_B$ equal to 1.8 V, thus driving the control terminal B of the power transistor 3 which is closed and in order to regulate the output low supply voltage VDD_LV at the substantially constant voltage value 1.2 V.

The power transistor 3 receives at the first terminal C the input high supply voltage VDD_HV=3.3 V, receives at the control terminal B the first control signal $S1_{ctrl}$ having a voltage value $V_B$=1.8 V and thus the power transistor 3 is closed. The voltage value of the second terminal E of the power transistor 3, which is equal to the output low supply voltage VDD_LV, has reached the nominal value 1.2 V.

The Low voltage detector 24 is supplied by the input high supply voltage VDD_HV=3.3 V, it receives the output low supply voltage VDD_LV=1.2 V and detects that the value of the output low supply voltage VDD_LV is greater than the value of the low voltage threshold $V_{th\_lv}$=1.1 V: therefore the Low voltage detector 24 generates the low voltage status signal $S_{lvd\_st}$ having an high logic value indicating that the value of the output low supply voltage VDD_LV is sufficient to allow a correct operation of the electronic components supplied by the output low supply voltage VDD_LV.

The first level shifter 28 receives the low voltage status signal $S_{lvd\_st}$ having the high logic value and generates therefrom the level shifted low voltage status signal $S_{lvd\_st\_ls}$ having an high logic value.

The OR logic gate 26 receives the inverted level shifted by-pass signal $\hat{S}_{by\text{-}pass\_ls}$ having a low logic value, receives the level shifted low voltage status signal $S_{lvd\_st\_ls}$ having the high logic value and generates therefrom the masked signal $S_{msk}$ having an high logic value which allows the transmission of the high logic value of the level shifted low voltage status signal $S_{lvd\_st}$ towards the Reset detector 25 (and thus it allows the transmission of the high logic value of the low voltage status signal $S_{lvd\_st}$).

The Reset detector 25 receives the masked signal $S_{msk}$ having the high logic value and generates therefrom the reset signal $S_{rst}$ having an high logic value which prevents the reset of the CPU core 4.

The CPU core 4 receives the reset signal $S_{rst}$ having the high logic value and the CPU core 4 is in the normal mode: the CPU core 4 reads the software program from the RAM memory 8, executes it and performs the test of the functionality of the System-on-chip 2.

Advantageously, the pull-down resistor $R_{pd}$ inside the Controller 10 has the function to improve the safety of the Systemon-chip 2. In fact, if the System-on-chip 2 is in the normal operation mode and is operating in the time period comprised between $t_0'$ and $t_2'$ wherein the power-on-reset signal $S_{POR}$ has a high logic value and it occurs a unwanted transition of the second control signal $S2_{ctrl}$ to a high voltage value, the by-pass signal $S_{by\text{-}pass}$ has a transition to a low logic value, which causes the System-on-chip 2 to enter the test operation mode and thus the Voltage regulator 15 is by-passed. In this case the pull-down resistor $R_{pd}$ has the function to discharge the voltage value of the second control signal $S2_{ctrl}$ to 0 V (thus to a low logic value) so that that the by-pass signal $S_{by\text{-}pass}$ has a transition back to a high logic value, which causes the restore of the normal operation mode of the System-on-chip 2 and thus restores the enable of the Voltage regulator 15. If the System-on-chip 2 is in the normal operation mode and is operating after time $t_2'$ wherein the power-on-reset signal $S_{POR}$ has a low logic value, the by-pass signal $S_{by\text{-}pass}$ is maintained to the high logic value also in case of an unwanted transition of the second control signal $S2_{ctrl}$ to the high voltage value and thus again it's prevented the by-pass of the Voltage regulator 15 during the normal operation mode, until a new start-up of the System-on-chip 2.

Figure 7:
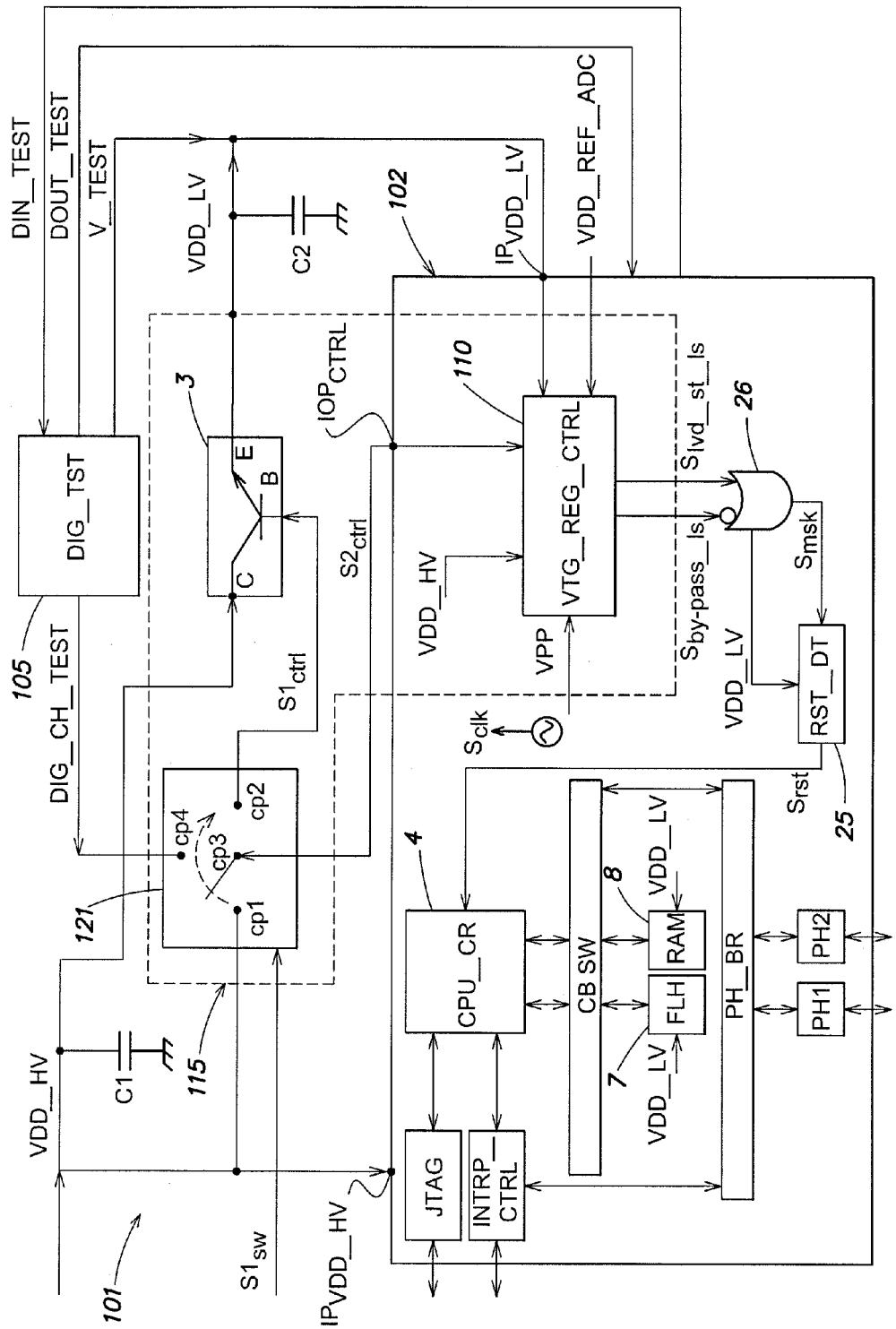
FIG. 7 schematically shows a Test system according to a second embodiment.

Referring to FIG. 7, it shows a Test system 101 according to a second embodiment, wherein blocks with the same functionality as the first embodiment are indicated with the same reference numbers.

The Test system 101 differs from the Test system 1 in that it includes:

a switch 121 instead of the switch 21;

a Digital Tester 105 which has a function similar to the one of the Digital Tester 5;

a Voltage regulator Controller 110 which has a function similar to the one of the Voltage regulator Controller 10;

a Voltage regulator 115 which has a function similar to the one of the Voltage regulator 5;

a test input pin for receiving a signal VPP having a high logic value for activating the test operation mode, wherein the signal VPP is calculated from an Input/Output supply voltage;

an input pin for receiving a signal VDD_REF_ADC having a high logic value to provide a supply voltage to an Analog-to-Digital converter.

The Digital Tester 105 further includes an output data terminal for generating a digital channel test signal DIG_CH_TEST to control the connection between the connection point cp3 and the connection point cp4 during the test operation mode. The signals VPP, VDD_REF_ADC and DIG_CH_TEST have the function to perform the by-pass of the Voltage regulator 115 at the start-up of the test operation mode.

The switch 121 has a connection point cp3 connected to the terminal carrying the second control signal $S2_{ctrl}$, a connection point cp1 connected to the terminal carrying the input high supply voltage VDD_HV, a connection point cp2 connected to the terminal carrying the first control signal $S1_{ctrl}$ and a connection point cp4 connected to the terminal carrying the digital channel test signal DIG_CH_TEST. The switch signal $S1_{sw}$ is such to have a first value for connecting the connection point cp3 to the connection point cp1 during the test operation mode, it is such to have a second value for connecting the connection point cp3 to the connection point cp2 during the normal operation mode and it is such to have a third value for connecting the connection point cp3 to the connection point cp4 during the test operation mode. In particular, the first and third values are assigned by a test operator during a test operation mode performed before selling the System-on-chip 102. The second value is assigned by the test operator during a normal operation mode performed before selling the System-on-chip 102.

The Voltage regulator Controller 110 differs from the Voltage regulator Controller 10 in that it includes:

a By-pass detector 130 (see FIGS. 8A and 8B) instead of the By-pass detector 30;

an input terminal for receiving the signal VPP;

an input terminal for receiving the digital channel test signal DIG_CH_TEST;

an input terminal for receiving the signal VDD_REF_ADC.

Figure 8A:
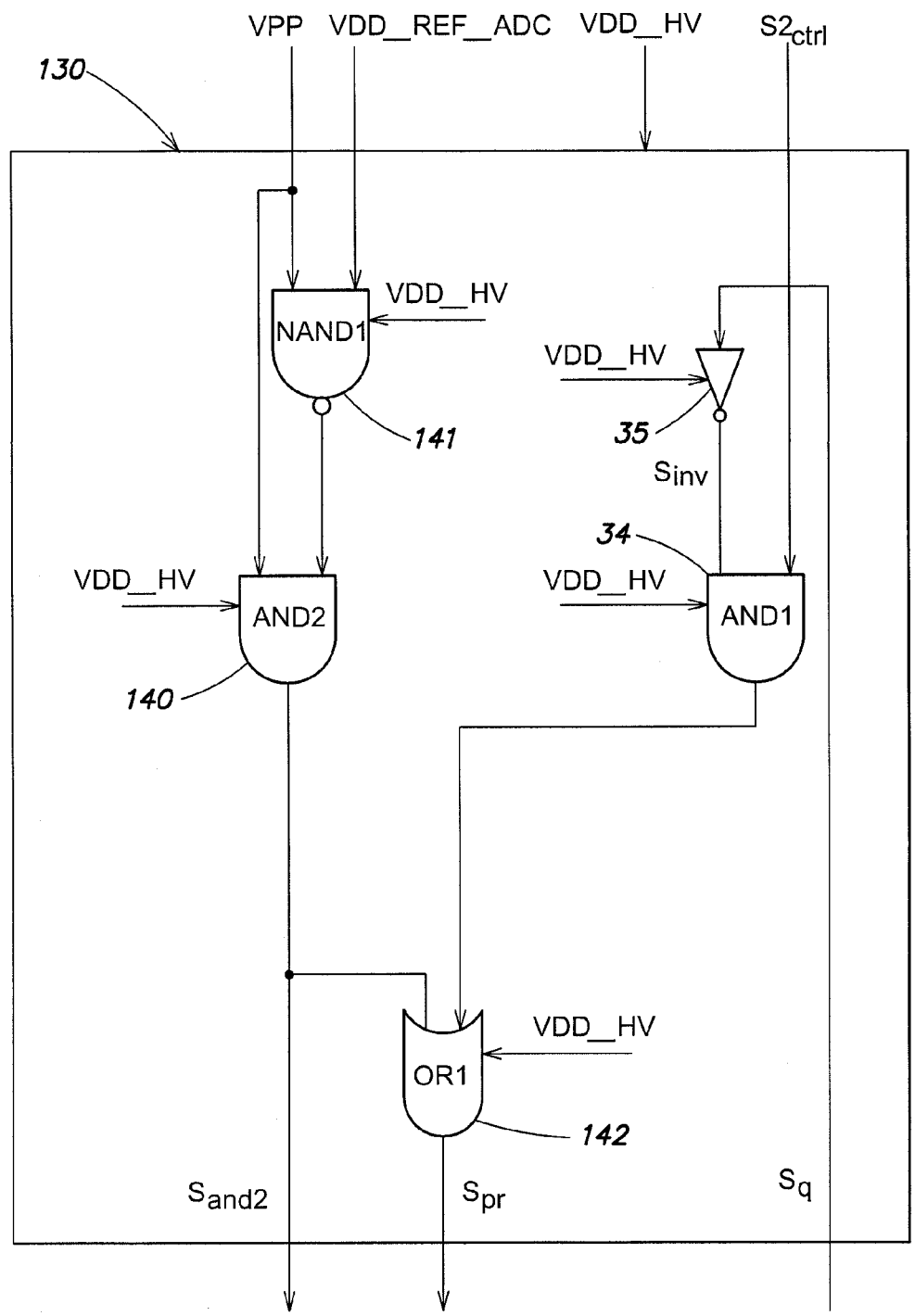
FIGS. 8A-8B schematically show a By-pass detector according to the second embodiment.
Figure 8B:
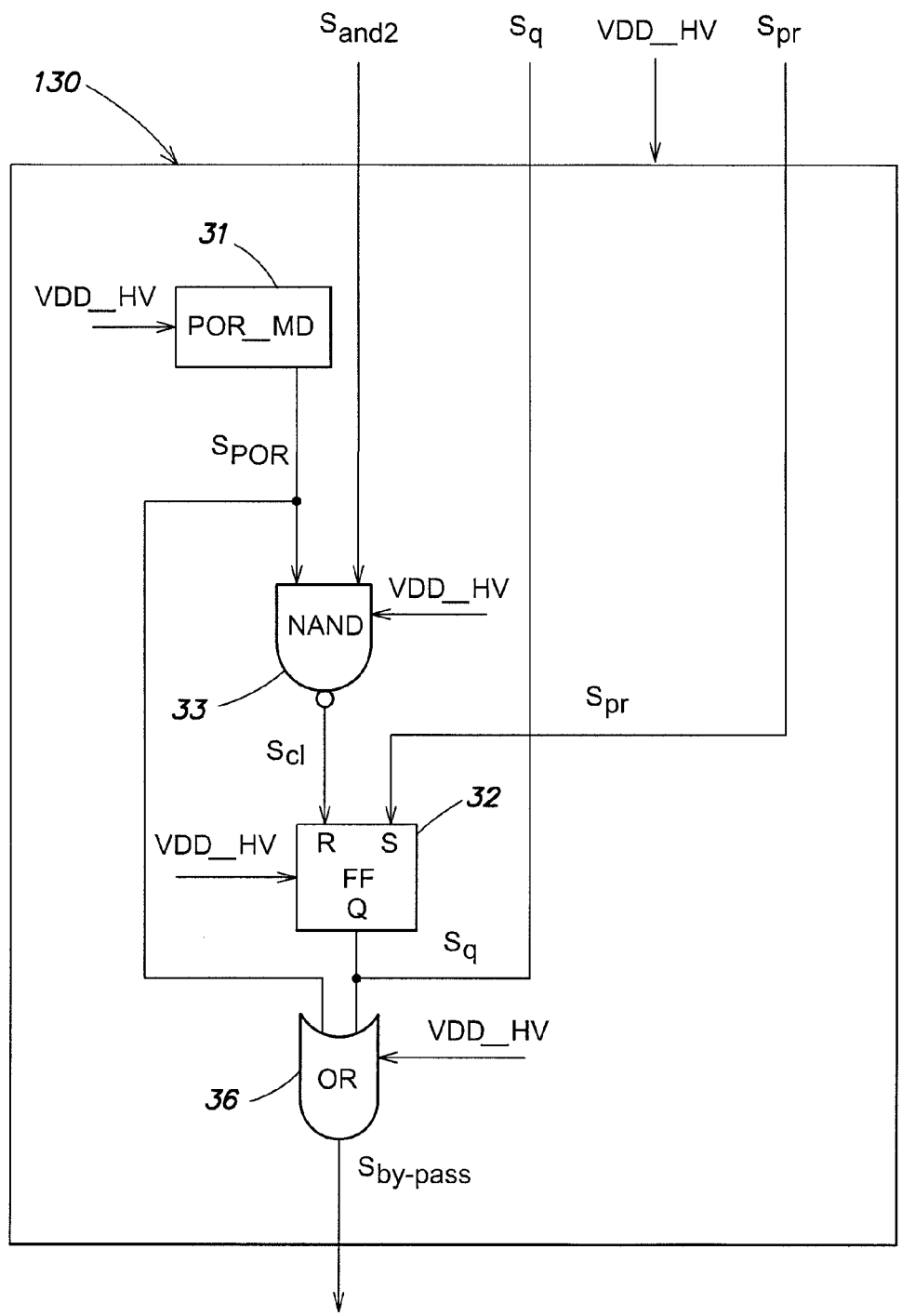

Referring to FIGS. 8A-8B, they show the By-pass detector 130 according to the second embodiment. In FIGS. 8A-8B components with the same or similar functionality of FIG. 5 are indicated with the same reference numbers.

The By-pass detector 130 includes an inverter logic gate 35, an AND logic gate 34, a NAND logic gate 141, an AND logic gate 140, an OR logic gate 142, a NAND logic gate 33, a set-reset Flip-flop 32, an OR logic gate 36 and a Power-on-reset module 31: these components are electrically connected each other as indicated in FIGS. 8A and 8B.

Figure 9:
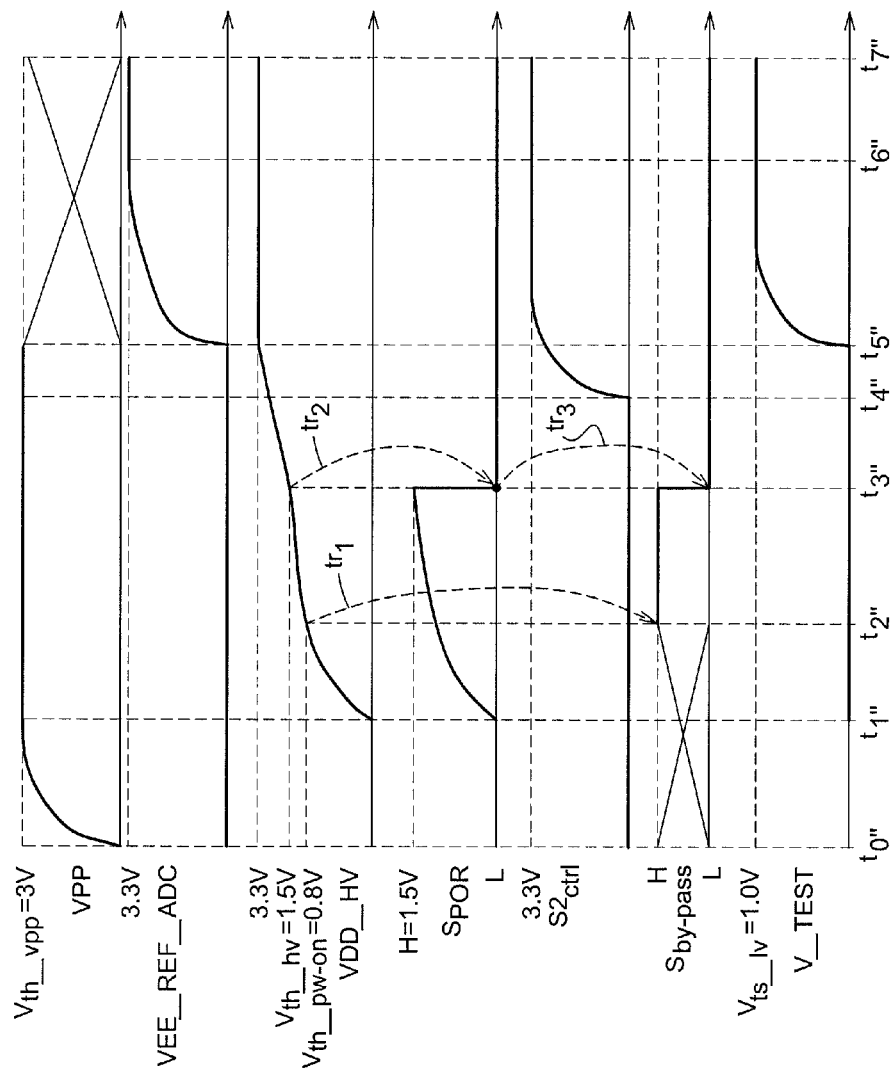
FIG. 9 schematically shows a possible trend of some signals of the Test system according to the second embodiment during the start-up phase of the test operation mode of the System-on-chip.

Referring to FIG. 9, it shows a possible trend of the signal VPP, of the input high supply voltage VDD_HV, of the signal VDD_REF_ADC, of the power-on-reset signal $S_{POR}$, of the second control signal $S2_{ctrl}$, of the by-pass signal $S_{by\text{-}pass}$ and of the test supply voltage signal V_TEST according to the second embodiment of the invention, during the start-up phase of the test operation mode comprised between time instants $t_0''$ and $t_7''$ wherein the System-on-chip 102 is supplied for the first time or wherein the System-on-chip 102 is supplied again after a switch-off of the Test system 101.

It is possible to note that:

the trend of input high supply voltage VDD_HV is increasing from 0 V at time $t_1''$ to its nominal value (which is supposed equal to 3.3 V) at time $t_5''$;

the trend of the power-on-reset signal $S_{POR}$ is equal to the trend of input high supply voltage VDD_HV during the time period comprised between $t_1''$ and $t_3''$;

the value of the second control signal $S2_{ctrl}$ is 0 V during the time period comprised between $t_0''$ and $t_4''$ and it has a trend increasing from 0 V to 3.3 V during the time period comprised between $t_4''$ and $t_6''$;

when the input high supply voltage VDD_HV reaches at time $t_2''$ the value of the power-on threshold $V_{th\_pw\text{-}on}$ (which is supposed equal to 0.8 V), the by-pass signal $S_{by\text{-}pass}$ assumes an high logic value H (see the dashed arrow $tr_1$);

when the input high supply voltage VDD_HV reaches at time $t_3''$ the value of the high voltage threshold $V_{th\_hv}$ (which is supposed equal to 1.5 V), the power-on-reset signal $S_{POR}$ has a transition to the low logic value L (see the dashed arrow $tr_2$), which in turn causes a transition of the by-pass signal $S_{by\text{-}pass}$ to the low logic value L (see the dashed arrow $tr_3$);

when the input high supply voltage VDD_HV reaches at time $t_5''$ its nominal value (which is supposed equal to 3.3 V), the test supply voltage V_TEST has a trend increasing from 0 V to a test value $V_{ts\_lv}$ (which is supposed equal to 1.0 V) different from the nominal value (which is supposed equal to 1.2 V) of the output low supply voltage VDD_LV;

the signal VPP has a trend increasing from 0 V at time $t_0''$ to a value of a voltage threshold $V_{th\_vpp}$ (which is supposed equal to 3 V) at time $t_1''$, it maintains the value of the voltage threshold $V_{th\_vpp}$ between time $t_1''$ and time $t_5''$ and it has a negligible value after time $t_5''$;

the signal VDD_REF_ADC is equal to zero volt from time $t_0''$ to time $t_5''$, it has a trend increasing to 3.3 V from time $t_5''$ to time $t_6''$ and it maintains the value 3.3 V from time $t_6''$ to time $t_7''$.

An embodiment includes an integrated circuit including the System-on-chip 2 and, preferably, the power transistor 3.

An embodiment also provides a method for performing the by-pass of a Voltage regulator 15 at the start-up phase of a test operation mode. The method comprises the step a) of providing the Voltage regulator 15 including a first input terminal $IP_{VDD\_HV}$ for receiving an input supply voltage VDD_HV, including a second input terminal $IP_{VDD\_LV}$ for receiving a test supply voltage V_TEST or for receiving a regulated output supply voltage VDD_LV as a function of the input supply voltage VDD_HV and including a power transistor 3 for generating the regulated output supply voltage VDD_LV, comprises the step b) of activating the test operation mode, the step c) of receiving a control signal $S2_{ctrl}$ equal to the input supply voltage VDD_HV, the step d) of receiving the input supply voltage VDD_HV having a substantially increasing trend, detecting that the input supply voltage VDD_HV is equal to a first voltage threshold $V_{th\_hv}$ and generating, as a function of the detected signal $S_{POR}$ and of the control signal $S2_{ctrl}$, a by-pass signal $S_{by-pass}$ having a transition from a first logic value to a second logic value for indicating a by-pass status of the Voltage regulator, comprises the step e) of receiving the by-pass signal having the second logic value and opening the power transistor 3 and the step f) of receiving at the second input terminal the test supply voltage V_TEST having a test value different from a nominal value of the regulated output supply voltage VDD_LV.

Preferably, the method further includes, between the steps c) and d), the step c1) of receiving the input supply voltage VDD_HV having the substantially increasing trend, detecting that the input supply voltage VDD_HV is equal to a second voltage threshold $V_{th\_pw-on}$ smaller than the first voltage threshold $V_{th\_by}$ and generating, as a function of the detected signal $S_{POR}$ and of the control signal $S2_{ctrl}$, the by-pass signal $S_{by-pass}$ having the first logic value for indicating an enable status of the Voltage regulator 15.

An embodiment provides a method for enabling the operation of a Voltage regulator 15 at the start-up phase of a normal operation mode. The method comprises the step a') of providing the Voltage regulator 15 including a first input terminal $IP_{VDD\_HV}$ for receiving an input supply voltage VDD_HV, including a second input terminal $IP_{VDD\_LV}$ for receiving a regulated output supply voltage VDD_LV as a function of the input supply voltage VDD_HV and including a power transistor 3 for generating the regulated output supply voltage VDD_LV, comprises the step b') of activating the normal operation mode, the step c') of receiving the input supply voltage VDD_HV having a substantially increasing trend, detecting that the input supply voltage VDD_HV is equal to a first voltage threshold $V_{th\_hv}$ and generating, as a function of the detected signal $S_{POR}$ and of a control signal $S2_{ctrl}$ equal to a logic value, a by-pass signal $S_{by-pass}$ having a first logic value for indicating an enable status of the Voltage regulator 15, comprises the step d') of receiving the by-pass signal $S_{by-pass}$ having the first logic value and closing the power transistor 3 and the step e') of receiving at the second input terminal the regulated output supply voltage VDD_LV as a function of the input supply voltage VDD_HV.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A voltage regulator comprising:
   a first input terminal configured to receive an input supply voltage;
   a second input terminal configured to receive a regulated output supply voltage as a function of the input supply voltage or to receive a test supply voltage;
   a power transistor including an input terminal configured to receive the input supply voltage and including an output terminal configured to generate the regulated output supply voltage;
   wherein the voltage regulator is configured, during a start-up phase of a test operation mode, to
      receive a control signal having a voltage value equal to the input supply voltage,
      receive the input supply voltage having an increasing trend, detect that the input supply voltage is equal to a first voltage threshold and generate, based upon the detection and the control signal, a by-pass signal having a transition from a first logic value to a second logic value for indicating a by-pass status of the voltage regulator,
      receive the by-pass signal having the second logic value and open the power transistor;
   and wherein the second input terminal is configured, during the test operation mode, to receive the test supply voltage having a test value different from a nominal value of the regulated output supply voltage.

2. The voltage regulator according to claim 1, further including:
   a switch configured to
      receive the input supply voltage and transmit the input supply voltage over the control signal, during the test operation mode, and
      receive the control signal and transmit the control signal over another control signal to control the operation of the power transistor, during a normal operation mode; and
   a voltage regulator circuit configured, during the normal operation mode, to generate the control signal to close the power transistor;
   and wherein the power transistor includes a control terminal for receiving, during the normal operation mode, the other control signal.

3. The voltage regulator according to claim 2, further comprising a power-on-reset module configured, during the start-up phase of the test operation mode, to
   receive the input supply voltage having the increasing trend and detect that the input supply voltage is equal to the first voltage threshold, and
   generate, based upon the detection, a power-on-reset signal having a transition from a first logic value to a second logic value;
   and wherein the voltage regulator is configured to generate, as a function of the power-on-reset signal having the second logic value and of the control signal equal to the input supply voltage, the by-pass signal having the transition from the first logic value to the second logic value.

4. The voltage regulator according to claim 3, wherein the power-on-reset module is further configured, during the start-up phase of the test operation mode, to
   receive the input supply voltage having the increasing trend and detect that the input supply voltage is equal to a second threshold less than the first voltage threshold, and
   generate, based upon the detection, the power-on-reset signal having the first logic value;

and wherein the voltage regulator is further configured to generate, as a function of the power-on-reset signal having the first logic value and of the control signal equal to the input supply voltage, the by-pass signal having the first logic value for indicating an enable status of the voltage regulator.

5. The voltage regulator according to claim 3, wherein the power-on-reset module is further configured, during a start-up phase of the normal operation mode, to receive the input supply voltage having the increasing trend, detect that the input supply voltage is equal to the first voltage threshold and generate therefrom the power-on-reset signal having a transition from the first logic value to the second logic value;
wherein the voltage regulator is further configured, during the normal operation mode, to
generate, as a function of the power-on-reset signal having the second logic value and of the control signal equal to a logic value, the by-pass signal having the first logic value for indicating an enable status of the Voltage regulator,
receive the by-pass signal having the first logic value and switch-on the voltage regulator circuit;
wherein the voltage regulator circuit is configured, during the normal operation mode, to receive the by-pass signal having the first logic value and generate therefrom the control signal to close the power transistor;
and wherein the power transistor is configured, during the normal operation mode, to receive the input supply voltage and generate therefrom the regulated output supply voltage over the second input terminal.

6. The voltage regulator according to claim 5, further including a pull-down resistor for generating the control signal, to enable the operation of the voltage regulator at a start-up of the normal operation mode or to recover the enable status of the voltage regulator in case of an unwanted transition of the voltage regulator to the by-pass status during the normal operation mode.

7. An electronic system comprising:
a voltage regulator comprising
a first input terminal configured to receive an input supply voltage,
a second input terminal configured to receive a regulated output supply voltage as a function of the input supply voltage or to receive a test supply voltage,
a power transistor including an input terminal configured to receive the input supply voltage and including an output terminal configured to generate the regulated output supply voltage;
wherein the voltage regulator is configured, during a start-up phase of a test operation mode, to
receive a control signal having a voltage value equal to the input supply voltage,
receive the input supply voltage having an increasing trend, detect that the input supply voltage is equal to a first voltage threshold and generate, based upon the detection and the control signal, a by-pass signal having a transition from a first logic value to a second logic value for indicating a by-pass status of the voltage regulator,
receive the by-pass signal having the second logic value and open the power transistor;
and wherein the second input terminal is configured, during the test operation mode, to receive the test supply voltage having a test value different from a nominal value of the regulated output supply voltage; and
a digital tester including an output voltage test terminal configured, during the test operation mode, to generate over the second input terminal the test supply voltage having the test value and to generate output data test signals carrying test patterns for testing the operation of at least one component inside the electronic system supplied by the test supply voltage.

8. The electronic system according to claim 7, wherein the digital tester is further configured, during the normal operation mode, to generate the output data test signals carrying test patterns for testing the functionality of the electronic system by supplying at least one component inside the electronic system with the regulated output supply voltage.

9. The electronic system according to claim 7, wherein the voltage regulator is further configured to generate a low voltage status signal to indicate if a value of the output supply voltage is smaller than a low voltage threshold and further comprising:
a logic gate configured, during the test operation mode, to receive the by-pass signal having the second logic value, to receive the low voltage status signal and to generate therefrom a masked signal for masking a value of the low voltage status signal;
a reset detector configured, during the test operation mode, to receive the masked signal and to generate therefrom a reset signal having a value for preventing a reset;
a CPU core configured to receive the reset signal and operating in a normal mode.

10. A method for performing a by-pass of a voltage regulator at a start-up phase of a test operation mode, the method comprising:
providing an input supply voltage at a first input terminal of the voltage regulator, providing a test supply voltage or a regulated output supply voltage as a function of the input supply voltage at a second input terminal of the voltage regulator, and generating the regulated output supply voltage with a power transistor of the voltage regulator;
activating the test operation mode;
receiving a control signal having a voltage value equal to the input supply voltage;
receiving the input supply voltage having a increasing trend, detecting that the input supply voltage is equal to a first voltage threshold and generating, based upon the detection and the control signal, a by-pass signal having a transition from a first logic value to a second logic value for indicating a by-pass status of the voltage regulator;
receiving the by-pass signal having the second logic value and opening the power transistor;
receiving at the second input terminal the test supply voltage having a test value different from a nominal value of the regulated output supply voltage.

11. The method according to claim 10, wherein the voltage regulator further includes:
a switch configured to
receive the input supply voltage and transmit the input supply voltage over the control signal, during the test operation mode, and
receive the control signal and transmit the control signal over another control signal to control the operation of the power transistor, during a normal operation mode; and
a voltage regulator circuit configured, during the normal operation mode, to generate the control signal to close the power transistor;
and wherein the power transistor includes a control terminal for receiving, during the normal operation mode, the other control signal.

12. The method according to claim 11, wherein the voltage regulator further comprises a power-on-reset module configured, during the start-up phase of the test operation mode, to receive the input supply voltage having the increasing trend and detect that the input supply voltage is equal to the first voltage threshold, and generate, based upon the detection, a power-on-reset signal having a transition from a first logic value to a second logic value;

and wherein the voltage regulator is configured to generate, as a function of the power-on-reset signal having the second logic value and of the control signal equal to the input supply voltage, the by-pass signal having the transition from the first logic value to the second logic value.

13. The method according to claim 12, wherein the power-on-reset module is further configured, during the start-up phase of the test operation mode, to receive the input supply voltage having the increasing trend and detect that the input supply voltage is equal to a second threshold less than the first voltage threshold, and generate, based upon the detection, the power-on-reset signal having the first logic value;

and wherein the voltage regulator is further configured to generate, as a function of the power-on-reset signal having the first logic value and of the control signal equal to the input supply voltage, the by-pass signal having the first logic value for indicating an enable status of the voltage regulator.

14. The method according to claim 12, wherein the power-on-reset module is further configured, during a start-up phase of the normal operation mode, to receive the input supply voltage having the increasing trend, detect that the input supply voltage is equal to the first voltage threshold and generate therefrom the power-on-reset signal having a transition from the first logic value to the second logic value;

wherein the voltage regulator is further configured, during the normal operation mode, to generate, as a function of the power-on-reset signal having the second logic value and of the control signal equal to a logic value, the by-pass signal having the first logic value for indicating an enable status of the Voltage regulator, receive the by-pass signal having the first logic value and switch-on the voltage regulator circuit;

wherein the voltage regulator circuit is configured, during the normal operation mode, to receive the by-pass signal having the first logic value and generate therefrom the control signal to close the power transistor;

and wherein the power transistor is configured, during the normal operation mode, to receive the input supply voltage and generate therefrom the regulated output supply voltage over the second input terminal.

15. The method according to claim 14, wherein the voltage regulator further includes a pull-down resistor for generating the control signal, to enable the operation of the voltage regulator at a start-up of the normal operation mode or to recover the enable status of the voltage regulator in case of an unwanted transition of the voltage regulator to the by-pass status during the normal operation mode.

* * * * *